United States Patent
Li

(10) Patent No.: US 9,953,436 B2
(45) Date of Patent: *Apr. 24, 2018

(54) LOW DELAY LOW COMPLEXITY LOSSLESS COMPRESSION SYSTEM

(71) Applicant: Dunling Li, Rockville, MD (US)

(72) Inventor: Dunling Li, Rockville, MD (US)

(73) Assignee: BTS Software Solutions, LLC, Columbia, MD (US)

( * ) Notice: Subject to any disclaimer, the term of this patent is extended or adjusted under 35 U.S.C. 154(b) by 17 days.

This patent is subject to a terminal disclaimer.

(21) Appl. No.: 13/927,028

(22) Filed: Jun. 25, 2013

(65) Prior Publication Data

US 2013/0343668 A1    Dec. 26, 2013

Related U.S. Application Data

(60) Provisional application No. 61/665,053, filed on Jun. 27, 2012, provisional application No. 61/664,530, filed on Jun. 26, 2012.

(51) Int. Cl.
| | |
|---|---|
| *G06T 9/00* | (2006.01) |
| *H04N 19/50* | (2014.01) |
| *H04N 19/119* | (2014.01) |
| *H04N 19/12* | (2014.01) |
| *H04N 19/174* | (2014.01) |
| *H04N 19/20* | (2014.01) |
| *H04N 19/88* | (2014.01) |

(52) U.S. Cl.
CPC ............... *G06T 9/00* (2013.01); *G06T 9/001* (2013.01); *H04N 19/119* (2014.11); *H04N 19/12* (2014.11); *H04N 19/174* (2014.11); *H04N 19/20* (2014.11); *H04N 19/50* (2014.11); *H04N 19/88* (2014.11)

(58) Field of Classification Search
CPC .... H04N 19/119; H04N 19/12; H04N 19/174; H04N 19/20; H04N 19/88; H04N 19/50; G06T 9/00; G06T 9/001

See application file for complete search history.

(56) References Cited

U.S. PATENT DOCUMENTS

| | | | |
|---|---|---|---|
| 6,462,791 B1 * | 10/2002 | Zhu | ........................... 375/240.27 |
| 6,606,355 B1 * | 8/2003 | Wei | ................................ 375/242 |
| 7,630,902 B2 * | 12/2009 | You | ................................ 704/500 |
| 2001/0019630 A1 | 9/2001 | Johnson | |
| 2002/0049979 A1 * | 4/2002 | White et al. | .................... 725/87 |
| 2002/0178258 A1 * | 11/2002 | Hushing et al. | .............. 709/224 |
| 2003/0058954 A1 * | 3/2003 | He | ................................ 375/262 |
| 2003/0197785 A1 * | 10/2003 | White et al. | ............. 348/207.99 |
| 2004/0054878 A1 * | 3/2004 | Debes et al. | ................... 712/221 |
| 2005/0222775 A1 * | 10/2005 | Kisra et al. | ..................... 702/14 |

(Continued)

*Primary Examiner* — Sean Motsinger
(74) *Attorney, Agent, or Firm* — Sheets Law Office; Kendal M. Sheets

(57) ABSTRACT

A method for compressing data is disclosed. The method may include receiving data from one or more data sources. The method may also include selectively classifying the data into one or more data streams, the one or more data streams including at least PCM-encoded data and image data. The method may further include separately compressing the PCM-encoded data and the image data into first and second compressed bit-streams. The method may also include shuffling the first and second compressed bit-streams.

18 Claims, 17 Drawing Sheets

(56) References Cited

U.S. PATENT DOCUMENTS

| | | |
|---|---|---|
| 2007/0031112 A1* | 2/2007 | Ricci .............................. 386/95 |
| 2007/0285438 A1* | 12/2007 | Kanowitz ..................... 345/632 |
| 2008/0262851 A1 | 10/2008 | Pang et al. |
| 2009/0240506 A1 | 9/2009 | Wuebbolt et al. |
| 2009/0265523 A1 | 10/2009 | Macy, Jr. et al. |
| 2011/0149072 A1* | 6/2011 | McCormack ................. 348/143 |
| 2012/0128162 A1 | 5/2012 | Chen et al. |
| 2015/0015426 A1* | 1/2015 | Lindahl et al. ................. 341/53 |

* cited by examiner

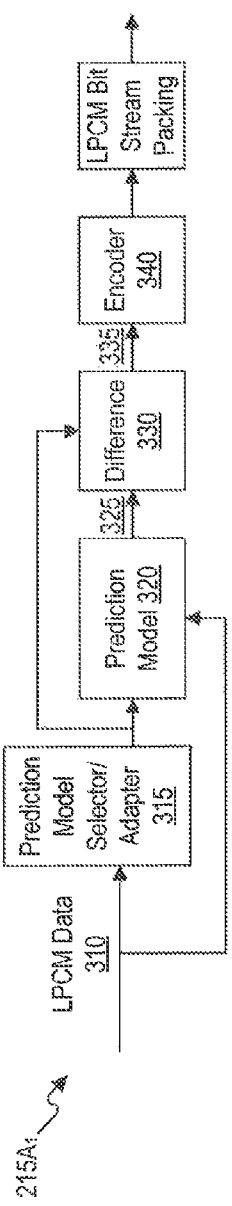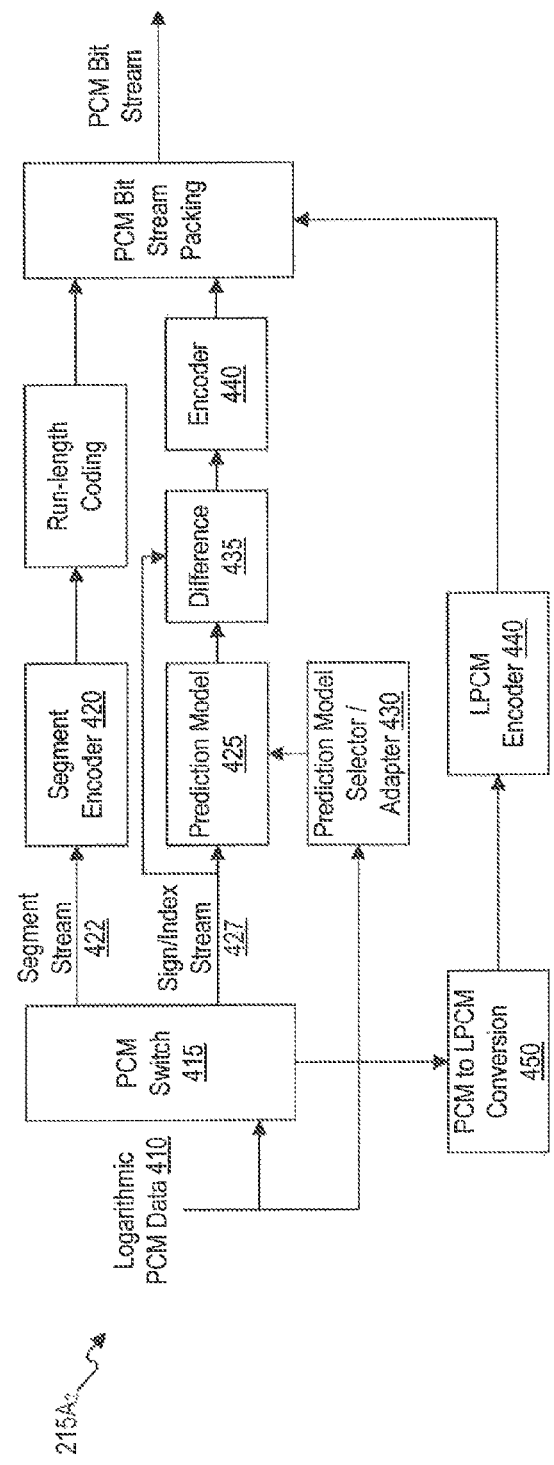
FIG. 3
FIG. 4

LOW DELAY LOW COMPLEXITY LOSSLESS COMPRESSION SYSTEM

PRIORITY

This application is based on and claims priority to U.S. Provisional Application No. 61/664,530, filed on Jun. 26, 2012 and U.S. Provisional Application No. 61/665,053, filed on Jun. 27, 2012. The disclosure of each of these provisional applications is incorporated herein by reference.

GOVERNMENT RIGHTS

This invention was made with government support under the terms of Contract No. HQ0147-13-C-7308 and Contract No. HQ0147-13-C-7024 awarded by the Missile Defense Agency (MDA). The government may have certain rights to this invention.

TECHNICAL FIELD

The present disclosure relates generally to methods and systems for data compression and data encoding and more particularly, to methods and systems for data compression and data encoding of telemetry data streams.

BACKGROUND

Telemetry is the measurement and transmission of data that is often collected at remote or inaccessible locations and transmitted to local sites, often for the purpose of real-time monitoring. Telemetry is used in various fields including, for example, space exploration, oil drilling, flight testing, missile testing, and meteorology. In many situations, the presence of a human observer at the point of data collection is not feasible, but real-time access to the data for analysis and decision-making may be necessary.

The extent to which data can be provided at a sufficient rate for real-time applications depends in part on how much data can be transmitted in a given bandwidth of the telemetry system. Data compression is one way in which the amount of data transmitted in a particular time interval can be increased. The principle of data compression is to reduce redundancy in a data set by efficient representation of intrinsic correlation in the data. Compression technologies can be divided into two categories: lossless and lossy. Lossless compression allows the exact original data to be reconstructed from the compressed data, while lossy compression cannot reconstruct data identical to the original, although a substantial amount of data can remain to satisfy the need of a given application.

When compressing data, the higher the compression ratio, the higher the potential rate of data transfer. However, data compression usually involves a trade-off between high compression ratio and resources (e.g., time, computing power, and power consumption). In real-time applications, in which the time between generation of data and the processing and receipt of the data should be as small as possible, computation complexity and delay costs often cannot be tolerated. Further limitations are imposed when lossless compression is desired. Lossless compression usually achieves a lower compression ratio as compared to lossy compression. Nevertheless, a low-delay, low-complexity, but high-ratio lossless compression of data is sometimes desirable for some real-time telemetry systems. Known compression algorithms, such as the Lempel-Ziv algorithm or Huffman coding, can be used to compress telemetry data, but these compression algorithms may not be able to reach sufficiently high compression ratios for the data. Furthermore, their computational complexity and delay costs may not be tolerable in real-time applications.

The disclosed systems and methods are directed to overcoming one or more of the shortcomings set forth above and/or other shortcomings of the prior art.

SUMMARY

In one aspect, the present disclosure is directed to a method for compressing data. The method may include receiving data from one or more data sources. The method may also include selectively classifying the data into one or more data streams, the one or more data streams including at least PCM-encoded data and image data. The method may further include separately compressing the PCM-encoded data and the image data into first and second compressed bit-streams. The method may also include shuffling the first and second compressed bit-streams.

In another aspect, the present disclosure is directed to a data transmission system. The system may include a local unit comprising a receiver. The system may also include a remote unit, the remote unit comprising transducers for generating data, a processor, and a transmitter. The processor may be configured to compress the data by classifying the data from the transducers into classifications including at least PCM-encoded data and image data. The processor may also separately compress the PCM-encoded data and the image data into first and second distinct compressed bit streams. The processor may further shuffle each of the first and second compressed bit-streams to introduce randomness to the respective compressed bit-stream. The transmitter may transmit the first and second compressed bit-streams to the local unit.

BRIEF DESCRIPTION OF THE DRAWINGS

FIG. 3 is a block diagram of an exemplary low-delay low-complexity lossless PCM compression encoder of FIG. 2 for linear PCM data;

FIG. 4 is a block diagram of an exemplary low-delay low-complexity lossless PCM compression encoder of FIG. 2 for logarithmic PCM data;

DETAILED DESCRIPTION

Figure 1:
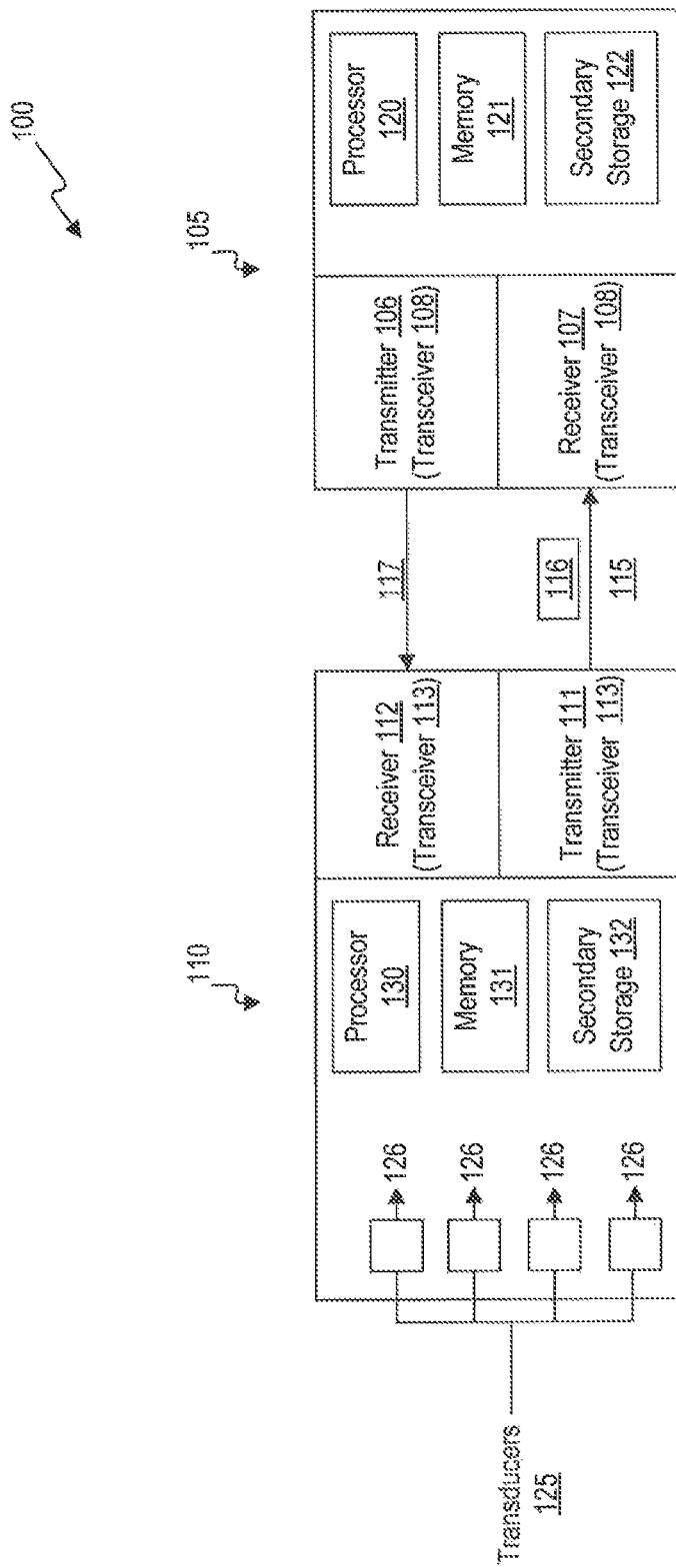
FIG. 1 is a block diagram of an exemplary disclosed telemetry system.

FIG. 1 illustrates an exemplary telemetry system 100 according to the disclosure. Telemetry system 100 may include a local unit 105 and a remote unit 110, which are in communication with each other. Telemetry system 100 may be used in various industries and applications in which measurements are collected at remote unit 110 and transmitted by remote unit 110 to local unit 105 for processing, storage, and/or utilization. Applications may include, but are not limited to, flight testing, oil-pipeline monitoring, ocean monitoring, and the provision of health care. In these examples, remote unit 110 may be associated with objects and/or environments of interests (e.g., a plane in the sky, a pipeline buried underground, a region of the ocean floor, and a patient in his or her private home) while local unit 105 may be associated with a location and/or user that is not immediately near remote unit 110. In an exemplary embodiment, remote unit 110 may be an airborne system and local unit 105 may be a ground system.

Local unit 105 may include a transmitter 106, a receiver 107, and/or a transceiver 108 for communicating with remote unit 110. Transmitter 106, receiver 107, and/or transceiver 108 may be configured for transmitting and/or receiving wireless and/or wired signals. Local unit 105 may receive a signal 115 via receiver 107 and/or transceiver 108 from remote unit 110. Signal 115 may include data 116 such as measurements of various parameters that are related to remote unit 110 or the surroundings of remote unit 110. Data 116 may include other information, such as data structure information, which may be needed for proper processing of data 116 by local unit 105, as explained in further detail below. Local unit 105 may include a processor 120, a memory 121, and/or a secondary storage 122, and any other components for handling data 116. Processor 120 may include one or more known processing devices such as a central processing unit (CPU), digital signal processing (DSP) processor, etc. Processor 120 may execute various computer programs to perform various methods of processing signal 115 and/or data 116. Memory 121 may include one or more storage devices configured to store information related to the execution of computer programs by processor 120. Secondary storage 122 may store computer programs and/or other information, including data 116 or information derived from data 116. Storage 122 may include volatile, non-volatile, magnetic, semiconductor, tape, optical, removable, non-removable, non-transitory, transitory, and/or other types of storage device or computer-readable medium.

Local unit 105 may also transmit a signal 117 via transmitter 106 and/or transceiver 108 to remote unit 110. In an exemplary embodiment, local unit 105 may be configured to automatically transmit signal 117 to remote unit 110 based on data 116. For example, local unit 105 may transmit feedback commands via signal 117 to remote unit 110 based on received data 116. In another exemplary embodiment, local unit 105 may be configured to receive commands manually-inputted by a user that are then transmitted to remote unit 110 via signal 117. In yet another exemplary embodiment, signal 117 may include software updates and/or any other data that may be useful for remote unit 110.

Remote unit 110 may include a transmitter 111, a receiver 112, and/or a transceiver 113 for communicating with local unit 105. Transmitter 111, receiver 112, and/or transceiver 113 may be configured for transmitting and/or receiving wireless and/or wired signals. Remote unit 110 may include one or more transducers 125, which generate measurement data 126. Transducers 125 may be any device which converts signals in one form of energy to another form of energy. For example, transducers 125 may include various sensors, for example, a temperature sensor (such as a thermocouple that converts a heat signal into an electrical signal), a motion sensor (such as an accelerometer that converts acceleration into an electrical signal or an inertial measurement unit (IMU) that measures velocity, orientation, acceleration, and/or gravitational forces using a combination of accelerometers and gyroscopes), and/or an electromagnetic wave receiver (such as an antenna which converts propagating electromagnetic waves into an electrical signal, e.g. GPS antenna). Other examples of transducers 125 include a pH probe, a hydrogen sensor, a piezoelectric crystal, a pressure sensor, a hydrophone, a sonar transponder, and/or a photodiode. Such list is not meant to be exhaustive. The above examples include converting a non-electrical signal to an electrical signal, but this disclosure is not limited to such examples. For example, transducer 125 may be a galvanometer, which converts electrical signals into a mechanical motion such as rotary deflection, and/or a speaker which converts electrical signals into air pressure.

The resulting signals generated and output by transducers 125 are referred to as measurement data 126 for purposes of this disclosure. Measurement data 126 may be related to the health and status of various components of remote unit 110, e.g., motors, electronics, payloads, and/or any other component of remote unit 110. Measurement data 126 may also be related to the operational status and/or kinematic state of remote unit 110 as a whole. Measurement data may be further related to the location and/or environment of remote unit 110.

Remote unit 110 may process the data 126 generated by transducers 125 and transmit them, via transmitter 111 and/or transceiver 113, as part of data 116 in signal 115 to local unit 105. Remote unit 110 may include a processor 130, a memory 131, and/or a secondary storage 132, as described above for local unit 105, for processing and/or storing the data from the signals generated by transducers 125 and other data. Remote unit 110 may receive signal 117, via receiver 112 and/or transceiver 113, from local unit 105. Signal 117 may include various data as discussed above in the description of local unit 105.

Various components may be implemented by processors, e.g., processor 120 and/or processor 130, wherein the illustrated components are implemented as software code that is executed by processor 120 and/or processor 130 to perform functions described below. Thus, while additional features and functions of local unit 105 and remote unit 110 are described above, these functions may be performed by processor 120 and/or processor 130.

Figure 2:
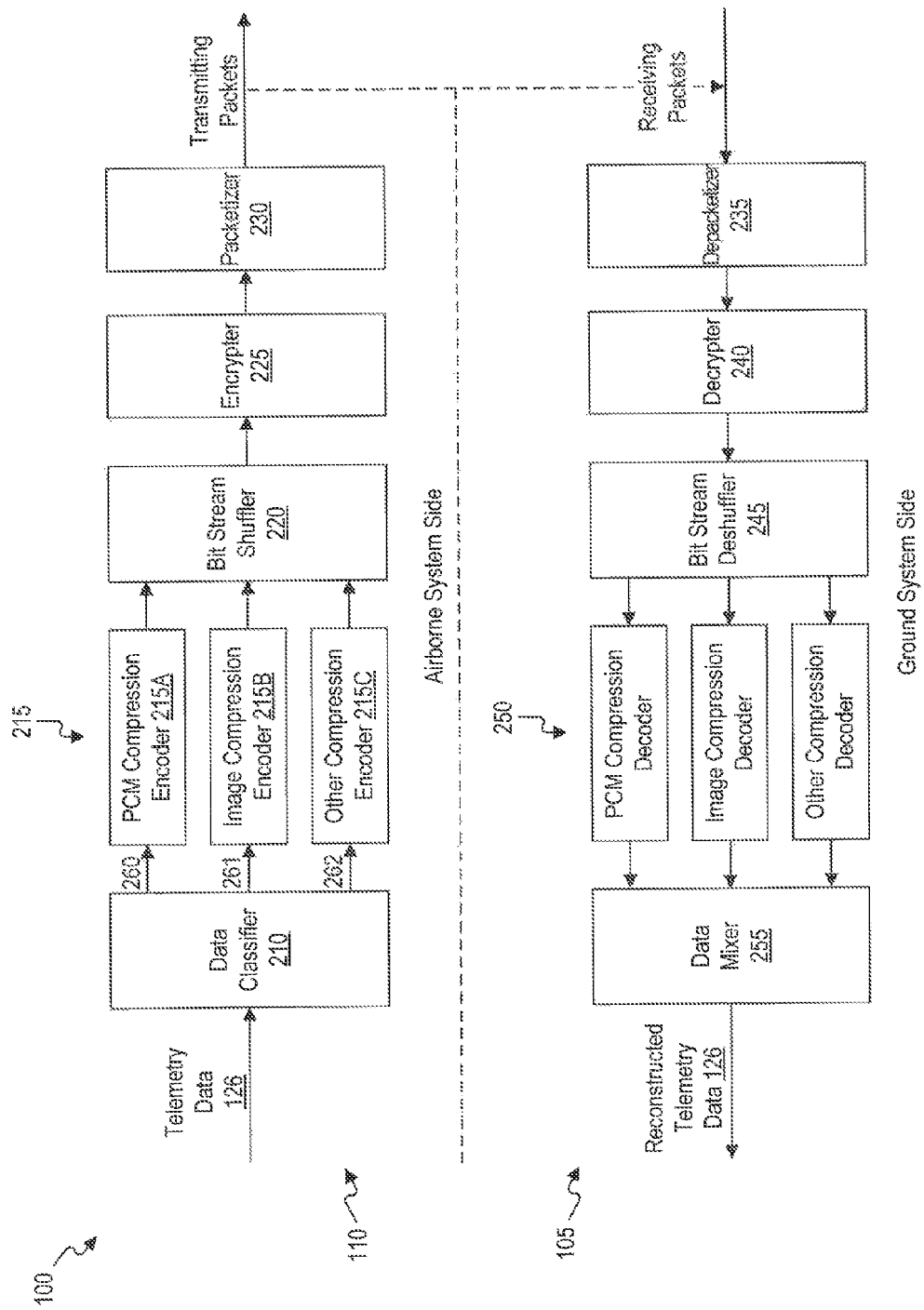
FIG. 2 is a block diagram of some aspects of this exemplary disclosed telemetry system of FIG. 1.

With reference to FIG. 2, remote unit 110 may also include a data classifier 210, a compression encoder 215, a bit stream shuffler 220, an encrypter 225, and a packetizer 230, which process and prepare data 126 for transmission to local unit 105. This processing may include compressing data 126. By classifying data 126 via data classifier 210, as discussed in further detail below, data 126 may be able to be compressed by compression encoders 215 with relatively high compression ratios and relatively low delay and computational costs. The compression-encoded data may be output as bit-streams, and bit-stream shuffler 220 may shuffle these bit-streams to remove possibly predictable patterns added by compression encoders 215. Encrypter 225 may encrypt the shuffled bit-stream, and packetizer 230 may perform packet protocol packetization for distributing the encrypted bit-stream as packets according to predefined protocols, such as TCP or UDP/IP. The packets may subsequently be transmitted to local unit 105 as data 116 (see FIG. 1). Local unit 105 may process the received packets with a similar process but in reverse order to produce reconstructed data 126 that may be identical to the data generated at remote unit 110. Local unit 105 may include a depacketizer 235, a decrypter 240, a bit-stream deshuffler 245, a compression decoder 250, and a data mixer 255, all of which process and reconstruct data 126. In an exemplary embodiment, disclosed systems and methods may be able to reach a 5:1 compression ratio for various data 126.

Data classifier 210 of remote unit 110 may receive, as input, data 126, which may include measurement data generated by transducers 125 and other data such as data structure information, and classify data 126 into different categories. In an exemplary embodiment, data classifier 210 may classify measurement data 126 into three categories: (1) pulse-code modulation (PCM) encoded measurement data 260, (2) image data 261, and (3) other data 262. In another exemplary embodiment, data classifier 210 may classify measurement data 126 more specifically into: (1) PCM-encoded measurement data, (2) image data, and (3) data structure information.

Remote unit 110 may convert measurement data 126 from transducers 125 into PCM-encoded measurement data 260. PCM is a well-known encoding scheme and, as such, is not further explained in detail. Linear PCM, in which signal levels are quantized and indexed based on constant quantization intervals, will be referred to as LPCM. Logarithmic PCM, in which signal levels are segmented into unequal quantization segments, and each quantization segment in divided and indexed based on equal quantization intervals within the segment, will be referred to as logarithmic PCM. The term PCM will generally refer to either or both LPCM and logarithmic PCM. Such PCM-encoded data 260 may be a component of data 126. Data 126 may also include image data 261. Image data 261 may be data streams from, for example, at least one IR- and/or visible-light video cameras, which may correspond to one of transducers 125. Image data 261 may have frame rates of around 10 to 50 Hz while PCM-encoded data 260 may have sampling rates of around 100 Hz. Image data 261 may comprise still images (e.g., photographs) and/or video, which are variable in two dimensions, as compared to data encoded as PCM-encoded data 260, which usually varies in one dimension, e.g., amplitude.

In an exemplary embodiment, PCM-encoded measurement data 260 may make up 40% and image data 261 may make up 50% of data 126. The remaining portion of data 126 may be other data 262.

After data classifier 210 classifies data 126 into different categories, each category of data may be compressed by a different compression encoder 215. PCM compression encoder 215A may be configured for compressing PCM-encoded measurement data 260 with low-delay low-complexity lossless compression. Because PCM sequences may be derived from generally continuous analog signals, PCM-encoded measurement data 260 may exhibit a continuity in its data sequences. Stated differently, sequential data values may be correlated, which allows for an exemplary PCM encoder 215A to use prediction models for the purpose of reducing redundancy in the data and facilitating higher compression ratio. Redundancy may be based on the number of bits used to code a message minus the number of bits of actual information in the message. For an exemplary PCM-encoded measurement data 260 generated with a sampling rate of 100 Hz, a 10 millisecond delay allows the prediction model to look at one sample ahead in time. PCM compression encoder 215A may determine a prediction model of the data by analyzing the correlation among input PCM-encoded measurement data 260 that has been obtained. An exemplary model may be a linear prediction model such as:

$$y_i = \sum_{k=1}^{n} a_k x_{i-k} + b_1 x_{i+1} \qquad (1)$$

where $x_i$ is the $i^{th}$ sample in the PCM-encoded measurement data 260 if LPCM, or is the quantization index of the $i^{th}$ sample in the PCM-encoded measurement data 260 if logarithmic PCM. $y_i$ is the corresponding predicted value of the sample. n is the order of the prediction model. $a_x$ and $b_1$ are prediction coefficients, which PCM compression encoder 215A may determine by the analysis of data sequences of input PCM data that has been obtained. The prediction coefficients may be calculated offline using optimization algorithms, trained using a set of known data, and/or real-time adapted. The coefficients may therefore be adjusted based on different specific data sequences.

The predicted value $y_i$ generated by the prediction model and the actual value $x_i$ of the sample may be almost the same, and therefore a difference signal z between $x_i$ and $y_i$ may be made up of mostly zeroes. As a result, PCM compression encoder 215A may be able to compress the difference signal z with a high compression ratio. In an exemplary embodiment, PCM compression encoder 215A may compress the difference signal z using an entropy encoding scheme such as Huffman coding or arithmetic coding. PCM compression encoder 215A may use other known encoding schemes including, for example, run-length encoding.

FIG. 3 illustrates a detailed block diagram of low-delay low-complexity lossless PCM compression encoder $215A_1$ as an exemplary embodiment of PCM compression encoder 215A of FIG. 2, in which the input PCM-encoded measurement data 260 is LPCM data 310. LPCM data 310 may be input into a prediction model selector/adapter 315 which determines the prediction model 320 to be utilized based on LPCM data 310, as described above. The prediction model 320 that is determined by prediction model selector/adapter 315 may receive LPCM data 310 and generate a prediction 325 of the LPCM data according to, for example, Equation 1. Difference unit 330 may receive LPCM data 310 and prediction 325 of the LPCM data and calculate a difference signal 335 between the two. Encoder 340 may then compression encode difference signal 335 before it is packetized for transmission.

FIG. 4 illustrates a detailed block diagram of a low-delay low-complexity lossless PCM compression encoder $215A_2$ as an exemplary embodiment of PCM compression encoder 215A of FIG. 2, in which the input PCM-encoded measurement data 260 is logarithmic PCM data 410. As described above, logarithmic PCM data 410 may include values corresponding to quantization segments and quantization indexes associated with the various segments. Often for logarithmic PCM data 410, the variation of segment values may be slow, therefore PCM compression encoder $215A_2$ may be able to encode the data more efficiently by separately encoding the quantization segments and quantization indexes. PCM compression encoder $215A_2$ may include a PCM switch 415, which may determine whether to encode logarithmic PCM data 410 with separate encodings for the quantization segments and quantization indexes, or convert PCM data 410 to LPCM data 310. This determination may be made based on the level of variation of the quantization segments of logarithmic PCM data 410. If the variation of quantization segments is slow, PCM switch 415 may determine that the data should remain as logarithmic PCM data 410. Segment encoder 420 may receive a segment data stream 422 comprising the bits of logarithmic PCM data 410 that correspond to the quantization segments, and prediction model 425 may receive an index data stream 427 comprising the bits that correspond to sign and quantization indexes. Segment encoder 420 may encode segment data stream 422 with, for example, run-length encoding. Index data stream 427 may be encoded using predictive encoding using prediction models, similarly as described above with respect to FIG. 3. That is, prediction model 427, which may be selected by prediction model selector/adapter 430 based on characteristics of logarithmic PCM data 410, may receive index data stream 427 and generate a prediction 432 of the index data stream. Difference unit 435 may determine a difference between prediction 437 and index data stream 427, which may then be encoded by encoder 440. If the variation of the quantization segments is fast, PCM switch 415 may determine that the data should be converted to LPCM data 310, by PCM-to-LPCM converter 450. After conversion, LPCM data 310 may be encoded, as discussed above with respect to FIG. 3. The encoded PCM-encoded data may then be packed into a bit stream for transmission.

Figure 5:
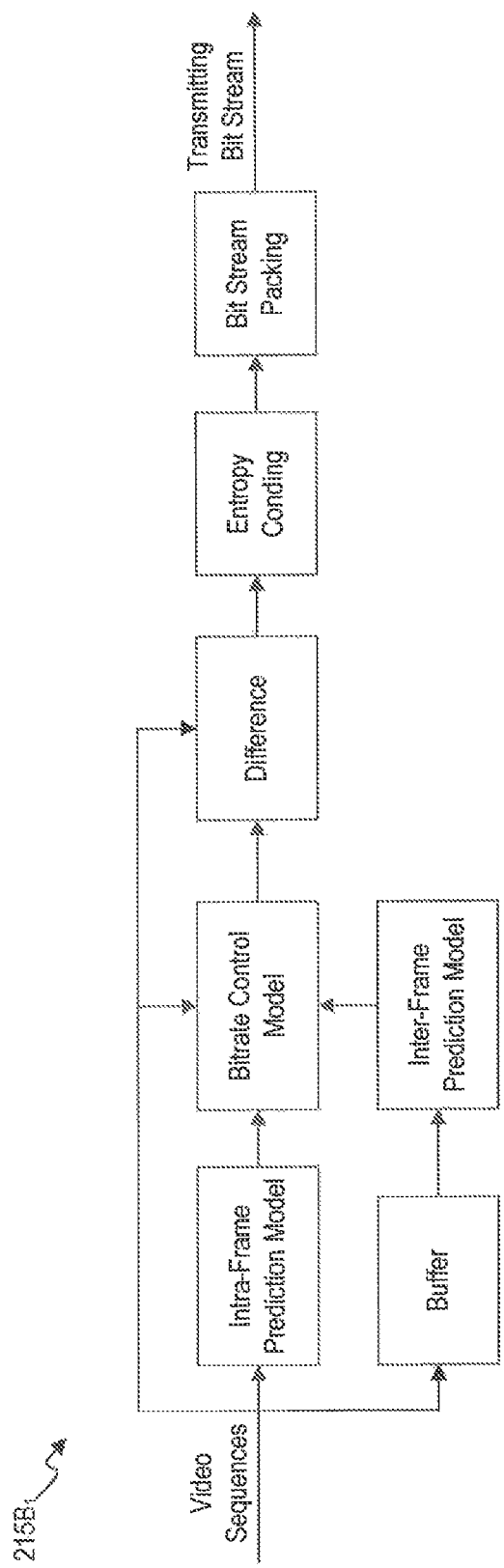
FIG. 5 illustrates a block diagram of an exemplary image compression scheme of FIG. 2.

With reference back to FIG. 2, remote unit 110 may include image compression encoder 215B for encoding image data 261. In an exemplary embodiment, image data 261 may be video data. As such, image compression encoder 215B may compress image data 261 based on correlation inside a video frame and among adjacent frames. FIG. 5 illustrates a block diagram for a video compression scheme $215B_1$ as an exemplary embodiment of image compression encoder 215B of FIG. 2. Generally, a prediction model for video may be used to remove intra-frame or inter-frame redundancy. The residual data, which is the difference between the actual data and the predicted data, may be mostly close to zero. The residual may then be encoded using an entropy encoding scheme, such as Huffman coding, run-length encoding, arithmetic coding, dictionary coding, and/or other known entropy coding. Image compression encoder 215B may utilize a variety of lossless video codecs, e.g., Moving JPEG-LS, Moving JPEG 2000, Lagarith, Huffyuv, Alparysoft, x.264 lossless, CorePNG, FV1, MSU, MPEG-2, MPEG-4, H.262, H.263, H.264 and/or others. Moving JPEG-LS may provide a better compression ratio at four times the rate of Moving JPEG 2000. The Lagarith lossless video code may balance between compression ratio and computation complexity. H.264/MPEG-4 Part 10 or AVC (Advance Video Coding) may provide the best performance in terms of compression ratio and compressed video quality. H.264/MPEG-4 AVC is currently the most widely adapted compression standard for high definition video. H.264/MPEG-4 AVC has a variety of implementation and optimizations available on different processors. Achievable compression ratios may highly depend on the content of image data 261. In an exemplary embodiment, the compression ratio that the above-listed video codecs may reach may be on average about 2:1 to 3:1. In some situations, a higher compression ratio of, for example, 5:1, may be desirable.

Figure 6:
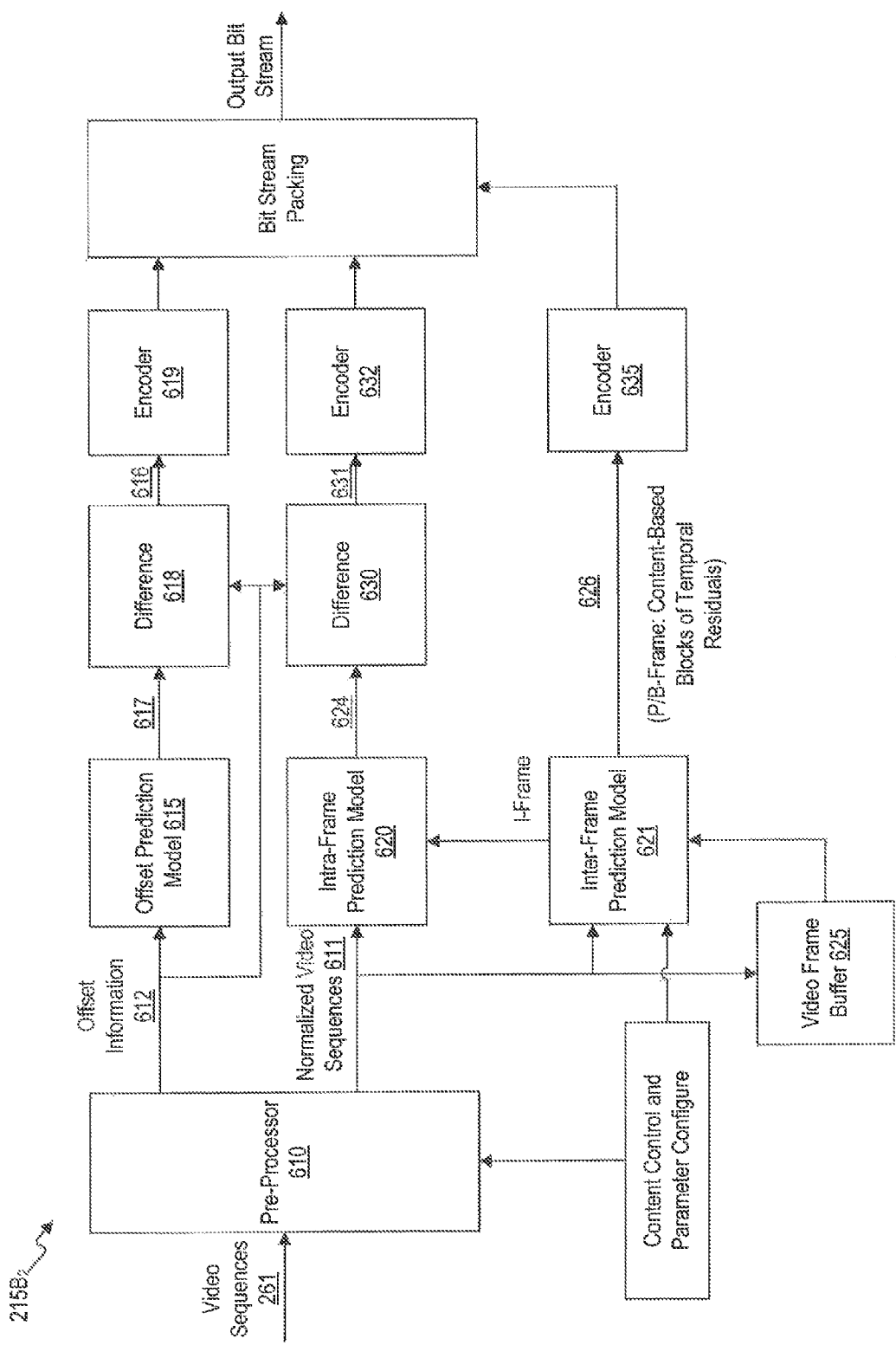
FIG. 6 illustrates a block diagram of an exemplary image compression encoder of FIG. 2 for compressing video-type image data.

To obtain higher compression ratios with low delay and low complexity, the image compression encoder may utilize knowledge of some data source characteristics, which may be determined using methods of content-adaptation and determination of specific parameter settings. FIG. 6 illustrates a block diagram for an image compression encoder $215B_2$ as an exemplary embodiment of image compression encoder 215B of FIG. 2 for compressing video-type image data 261, based on knowledge of the data content. Image compression encoder $215B_2$ may include a preprocessor 610 for normalizing image data 261 into normalized video sequences 611 and extracting offset information 612. The offset information 612 may be compressed using a time-domain linear prediction model followed by entropy encoding, similar to the process described for FIG. 3, in that an offset prediction model 615 generates a prediction 617 of offset information, a difference unit 618 determines the difference 616 between actual offset information 612 and prediction 617, and encoder 619 encodes the difference 616 using entropy encoding schemes. Offset information 612 often is constant or slow-varying for a given imagery sequence in image data 261, in which case encoder 619 may utilize, for example, run-length encoding. An intra-frame prediction model 620 and an inter-frame prediction model 621 may receive normalized video sequences 611. Intra-frame prediction model 620 may handle compression encoding related to data within one frame of normalized video sequences 611, and inter-frame prediction model 621 may handle compression encoding related to data of several frames of normalized video sequences 611. For inter-frame prediction model 621 to be able to compress image data 261 based on more than one frame, video frame buffer 625 may buffer one or more of the frames.

For example, the rate of video sequences 611 may vary from 10 Hz to 50 Hz. If maximum delay requirement is 10 milliseconds, inter-frame prediction model 621 may be able to look ahead up to two frames. Each frame of normalized video sequences 611 may be categorized into one of three different types of frames by image compression encoder $215B_2$ before being encoded using intra-frame prediction model 620 or inter-frame prediction model 621. The three categories of frames are: I-frames, P-frames, and B-frames. An I-frame (intra-frame) is a self-contained frame that can be independently decoded without any reference to other frames. A P-frame (predictive inter-frame) is a frame that makes references to parts of an earlier I- and/or P-frame to code the frame. A B-frame (bi-predictive inter-frame) is a frame that makes references to both an earlier reference frame and a future reference frame. In general, I-frames require more bits than P- and B-frames, but they are robust to transmission errors. P- and B-frames are sensitive to transmission errors, and B-frames introduce delays. Image compression encoder $215B_2$ may determine which type a particular frame is based on determination of the prediction errors, i.e. the difference between the prediction of either model and the actual data. If image compression encoder $215B_2$ determines that a frame is an I-frame, difference unit 630 determines a difference 631 (i.e., the residual) between the prediction 624 generated by intra-frame prediction model 620 and the actual frame data, and encoder 632 encodes the difference signal. In an exemplary embodiment, encoder 632 may encode the difference signal using entropy encoding such as arithmetic coding. Otherwise, image compression encoder $215B_2$ may determine that the frame is a P- or B-frame, and inter-frame prediction model 621 may generate a prediction signal 626 based on the correlation between multiple frames. This temporal correlation results in compressible P- and/or B-frame bit streams, which may be compressed by encoder 635.

Image compression encoder $215B_2$ may incorporate knowledge of the contents of image data 261 to achieve higher compression ratios. In some embodiments, image compression encoder $215B_2$ may analyze a video frame or a sequence of video frames and divide its contents into different shapes or object regions. Image compression encoder $215B_2$ may then compress each object independently to remove higher order correction in the frame or among the sequence of frames. The extracted objects may be represented efficiently by combining them with known characteristics of objects in the frames (spatial characteristics and/or temporal characteristics such as the motion of an object). Such content-based video coding may improve coding efficiency, robustness in error-prone environments, and content-based random access. Some content-based coding techniques suffer from very expensive computation costs due to segmentation, motion estimation, and overhead of object presentation (e.g., shape presentation or object descriptions). However, by utilizing prediction models that produce residuals that are then entropy coded, accurate object/shape segmentation and motion estimation may be less crucial. Accordingly, in an exemplary embodiment, image compression encoder $215B_2$ may avoid object presentations by using content blocks with flexible block sizes and computer complexity for coarse segmentation and motion estimation.

Figure 7:
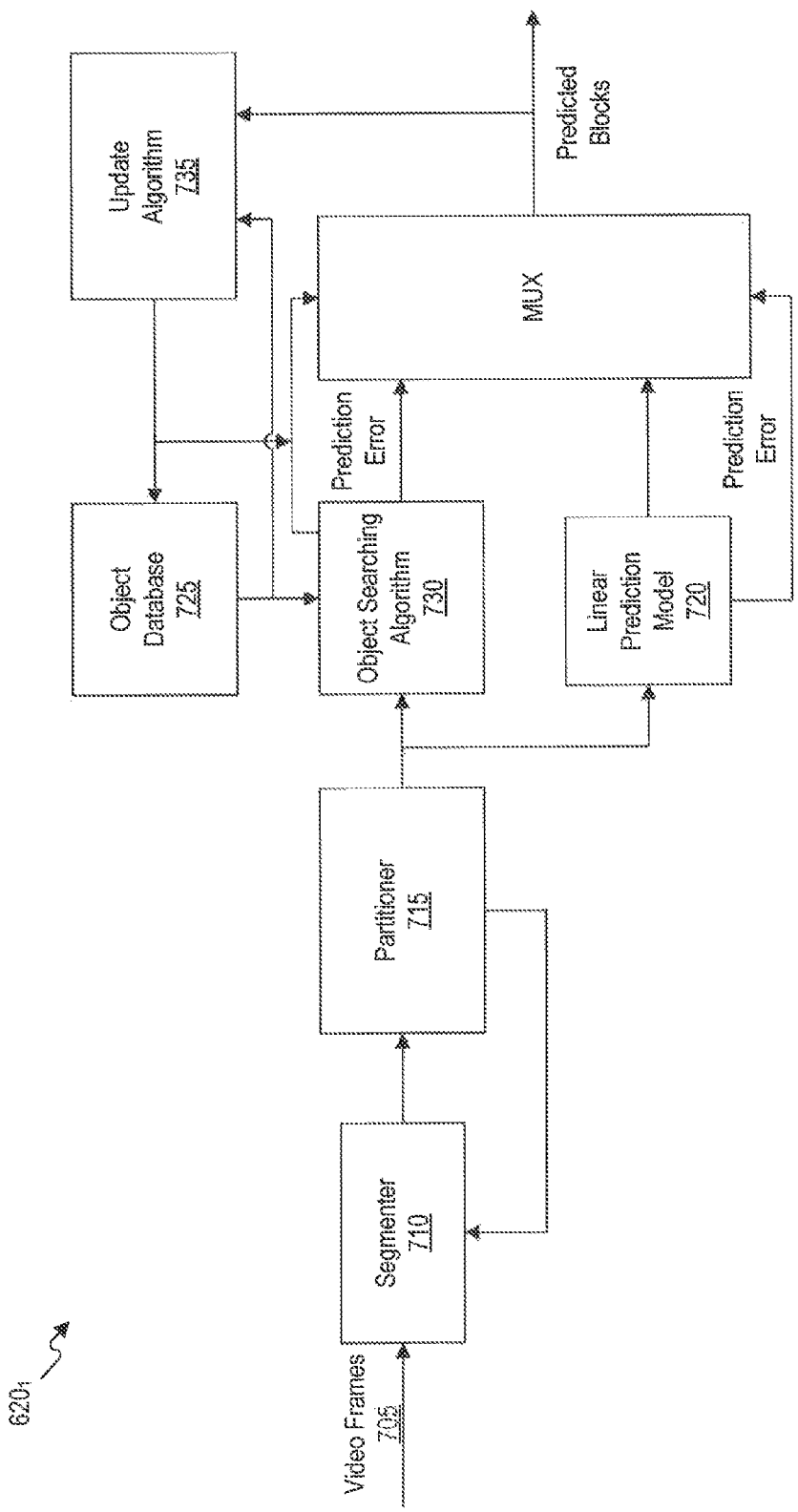
FIG. 7 illustrates a block diagram of an exemplary intra-frame prediction model of FIG. 6.

FIG. 7 illustrates a block diagram of an intra-frame prediction model $620_1$ as an exemplary embodiment of intra-frame prediction model 620 of FIG. 6 for generating predicted blocks of video frame 705. Segmenter 710 may receive and apply segmentation to frame 705. The segmentation may divide frame 705 into non-overlapped regions, wherein each region is considered to be an object. Partitioner 715 may then partition the entire frame 705 into overlapped object blocks with flexible sizes and locations. Each object block will be associated with either a prediction, by a linear prediction model 720, or a defined object as stored in an object database 725. Object database may include two categories of objects: pre-defined static objects and real-time adapted objects. An object-searching algorithm 730 may first search the real-time objects and then the predefined objects. An update algorithm 735 may update the real-time objects. The output of the intra-frame prediction model $620_1$ may comprise predicted block which best matches objects from the database or the predicted block output by linear prediction model 720, based on whichever minimizes total prediction errors. As is known in the art, a segment may be an object with specific delineations and bounds, and a partition may be a portion of the image data that includes multiple objects that is used to calculate compression across two segments.

Figure 8:
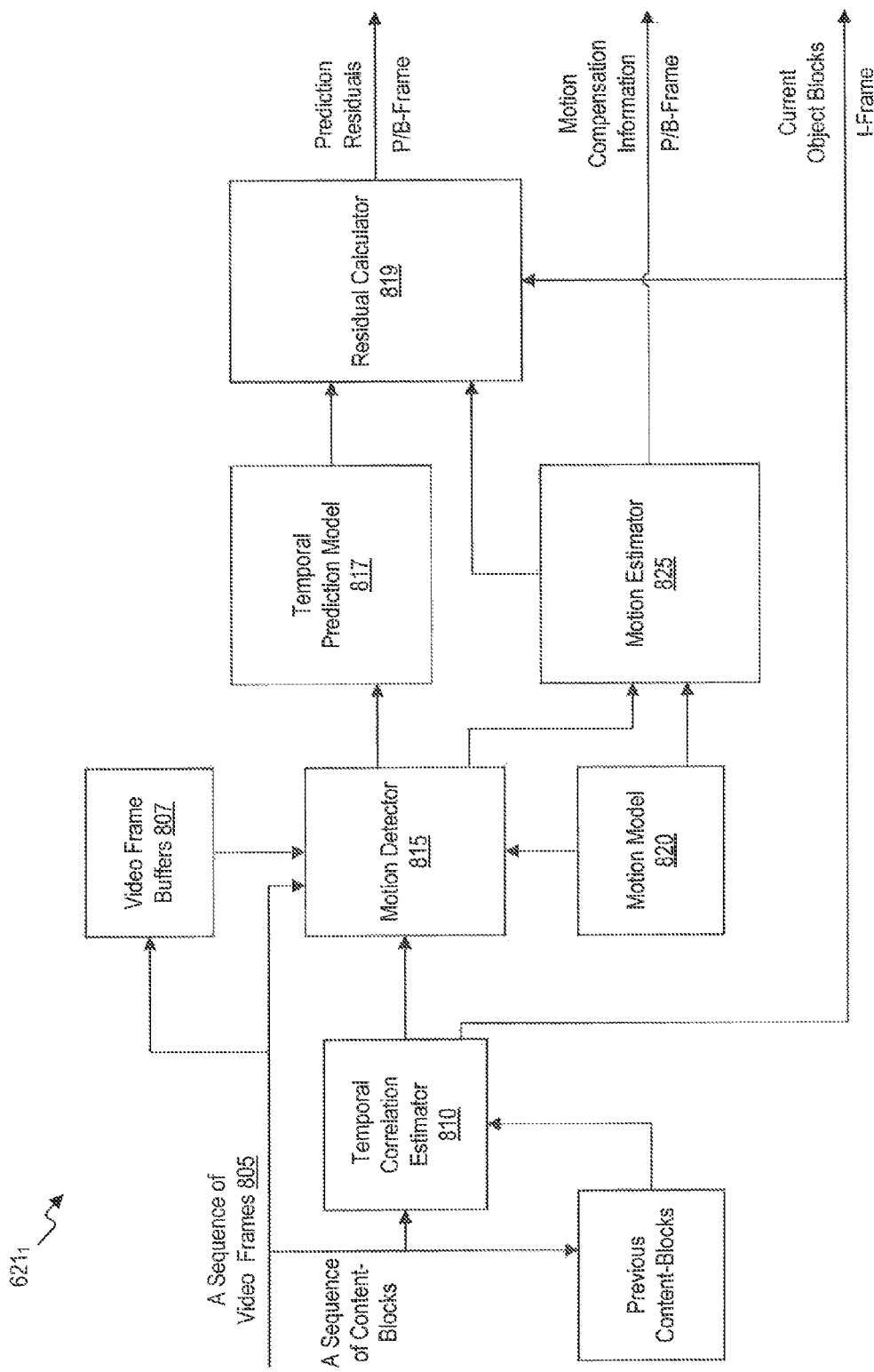
FIG. 8 illustrates a block diagram of an exemplary inter-frame prediction model of FIG. 6.

FIG. 8 illustrates a block diagram for an inter-frame prediction model $621_1$ as an exemplary embodiment of inter-frame prediction model 621 of FIG. 6. Temporal correlation estimator 810 may receive partitioned object blocks of one frame, in a sequence of video frames 805, and compare them with object blocks of previous frames. For example, comparisons may be made based on numbers, shapes, and/or intensities of the object blocks. Temporal correlation estimator 810 may decide the frame type based on the similarity of the object blocks between frames. If the level of similarity is low, the current frame may be encoded as I-frame using intra-frame prediction model 620. Otherwise, if the level of similarity is high enough, the frame may be encoded using the other components of inter-frame prediction model $621_1$. Motion detector 815 may receive the sequence of video frames 805 from video frame buffer 807 that includes the frame that is to be encoded. Motion detector 815 may identify motion objects from background objects. For background object blocks, a temporal prediction model 817 or interpolation may be applied, and a residual calculator 819 may calculate the prediction residual. The prediction residual may then be encoded with entropy encoding. For moving objects, motion compensation may be generated by a motion model 820 and motion estimator 825. That is, motion model 820 and motion estimator 825 may generate a prediction 827. If the prediction residual is large, then the current frame may be redefined as I-frame. Otherwise, motion compensation vectors which predict the motion of object and prediction residuals will be encoded. Motion detection and compensation are key components in advanced video codec. Usually, they consume the largest amount of computation time. For example, motion estimation uses about 60-80% of H.264 encoding time. To reduce the complexity of motion estimation, inter-frame prediction model $621_1$ may utilize motion models 820 which are defined by known knowledge of a given video source. Motion model 820 may list all possible motions, such as type, direction, speed limit, etc. for a given video source. Motion estimator 825 may utilize a simple motion estimation algorithm, such as small region diamond search, followed by adaptive motion vector refinement. The output of inter-frame prediction will provide encoding frame type and corresponding encoding information. Afterwards, this output may be further compressed using entropy encoding via encoder 635, as described for FIG. 6, for example.

In another embodiment, widely used image and video compression standards can be used with image data 261. For example, image compression encoder 215B may utilize H.264 AVC, which may be a suitable video codec for robust and reliable video compression for various embodiments of this disclosure. H.265 HEVC may be able to provide the same video quality as H.264 AVC with twice the compression ratio and complexity. Different reference implementations of H.265 HEVC are currently available for demonstration purposes. This codec may be used in various exemplary implementations of disclosed methods. Additionally, another compression standard is in CCSDS (Consultative Committee for Space Data Systems) lossless data compression, which was designed for satellite applications. The CCSDS lossless compression standard may be implemented with or instead of previous video codecs to achieve visually lossless video compression algorithms with low complexity.

With reference back to FIG. 2, remote unit 110 may include other compression encoder 215C for encoding other data 262 that is not PCM-encoded measurement data 260 or image data 261. Other data 262 may include already compressed data. In an exemplary embodiment, encoder 215C may group data sources that are highly correlated together and separate out data that is already compressed. Often, for already-compressed data, it may be difficult to obtain further data size reduction. Depending on the coding efficiency of the original compression algorithms, other compression encoder 215C may determine whether to keep the same compressed data or to decompress the compressed data and recompress it using any of the various encoding schemes described above, for example, using PCM compression encoder 215A for LPCM or logarithmic PCM. For data whose contents are numerical values, such as floating point values instead of linear PCM, other compression encoder 215C may determine that LPCM algorithms described above can be used to compress them. If the data's content is symbols, such as text messages, other compression encoder 215C may analyze the data characteristics and choose an appropriate entropy encoding scheme. In general, other compression encoder 215C may attempt to group correlated data together as multi-dimension vectors, establish correlation model among group members to reduce redundancy, and then apply a lossless compression algorithm.

In some exemplary embodiments, other data 262 may be specifically data structure information. Because data 126 may include data from various sources (e.g., measurement data 126 from multiple transducers 125, some of the measurement data being specifically image data 261), exemplary data 126 may be structured such that for one predetermined period of time (a frame), the various data signals are time-multiplexed and serialized according to a predefined structure. Data structure information may be provided as part of data 126 so that local unit 105 is able to synchronize to the periodic data and identify or extract specific types of data. Data structure information may include frame synchronization words (SYNC1 AND SYNC 2), sub-frame identification words (SFID), sub-sub frame synchronization words (XCounter), minor frame counters (MCounter), other counters (YCounter), and other known data structure information. Various exemplary embodiments for low-delay, low-complexity compression algorithms for SFID, SYNC1 and SYNC2 are discussed in further detail.

The SFID component may vary slowly, increasing or decreasing as the frame increases. As SFID varies with different numbers of frames, the key to a compression algorithm for SFID is to identify the variation direction and the number of frames for each SFID. The periodicity of the SFID variation may be extracted as a feature and used to design a low-delay, low-complexity, error-propagation-robust, adaptive-prediction algorithm to compress the SFID component. The format of the encoded bit stream may be defined as shown in Table 1. Test results show that the compression ratio varies with data memory size and packet size. If the packet size of data being transmitted from remote unit 110 to local unit 15 is one major frame per packet, the compression ratio is about 613:1. Although other formats may be used for encoding the bit-stream based on the characteristics of the particular SFID data, as well as other considerations, an exemplary format for encoding the bit stream as shown in Table 1 may be used.

TABLE 1

SFID Encoding Stream

| # of 16-bit Words | Contents | Values in Log File |
|---|---|---|
| 1 | Initial SFID value | 49067 |
| 2 | Up/down Indication | 1: Increase/0: decrease |
| 3 | # of peaks of SFID variation (N) | 1 |
| 4 (3 + 1) | Peak value 1 | 50431 |
| ... | ... | |
| 3 + N − 1 | Peak value N − 1 | |
| 3 + N | Peak value N | |
| 3 + N + 1 | # of varying periods (M) | 215 |
| 4 + N + 1 | Period 1 | 3737 |
| 4 + N + 2 | # of repeats of Period 1 | 1 |
| 4 + N + 3 | Period 2 | 6250 |
| 4 + N + 4 | # of repeats of Period 2 | 27 |
| ... | | |
| ... | | |
| 4 + N + 2M − 1 | # of repeats of Period M | 1437 |
| 4 + N + 2M | Period M | 1 |

The two 16-bit synchronization words (SYNC1 and SYNC2) typically represent constants. However, they may be changed during system operation. A low-delay, low-complexity lossless compression algorithm for the synchronization may be based on monitoring the synchronization words. Table 2 shows the structure of their encoding bit stream. The algorithm may exceed a 400:1 compression ratio when one major frame is used per packet. Although other formats may be used for encoding the bit stream based on the characteristics of the particular synchronization data, as well as other considerations, an exemplary format for encoding the bit stream as shown in Table 2 may be used.

TABLE 2

The Encoding Bit Stream of SYNC Words

| # of 16-bits words | Contents | Values in Log File |
|---|---|---|
| 1 | Sync Word 1 | 49067 |
| 2 | Sync word2 | 1: Increase/0: decrease |
| 3 | Process_size | In # of minor frames |
| 4 | Change flag for block 1 | Change: 1 or # of changes (N) No change: 0 |
| 5 | # of changes for both sync1 & 2 | N12 |
| 5 + 3(1~3) | (1$^{st}$ pos, 1$^{st}$ SW1 and SW2) | |
| ... | ... | |
| 5 + 3(N12 − 2~N12) | (N12th pos, N12th SW1 & SW2) | 215 |
| 5 + 3N12 + 1 | # of changes for sync1 | |
| 6 + 3N12 + (1~2) | (1$^{st}$ pos, 1$^{st}$ SW1) | 1 |
| ... | | 6250 |
| 6 + 3N12 + 2(N1 − 1~N1) | (N1$^{th}$ pos, N1$^{th}$ SW1) | 1 |

TABLE 2-continued

The Encoding Bit Stream of SYNC Words

| # of 16-bits words | Contents | Values in Log File |
|---|---|---|
| 6 + 3N12 + 2N1 + 1 | # of changes for sync2 | |
| 7 + 3N12 + 2N1 + (1~2) | (1$^{st}$ pos, 1$^{st}$ SW2) | 1 |
| | ... | 6250 |
| 7 + 3N12 + 2N1 + 2(N2 − 1~N2) | (N2$^{th}$ pos, N2$^{th}$ SW2) | 1 |
| | Change flag for block 2 | |
| 4 + N + 2M − 1 | # of repeats of Period M | 1437 |
| 4 + N + 2M | Period M | 1 |

Figure 9A:
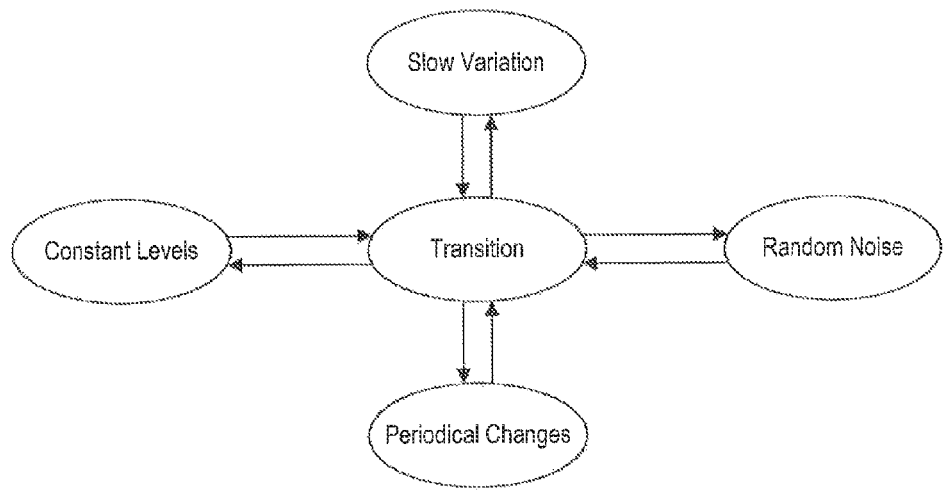
FIG. 9A illustrates a state machine of an exemplary multistate lossless compression scheme.
Figure 9B:
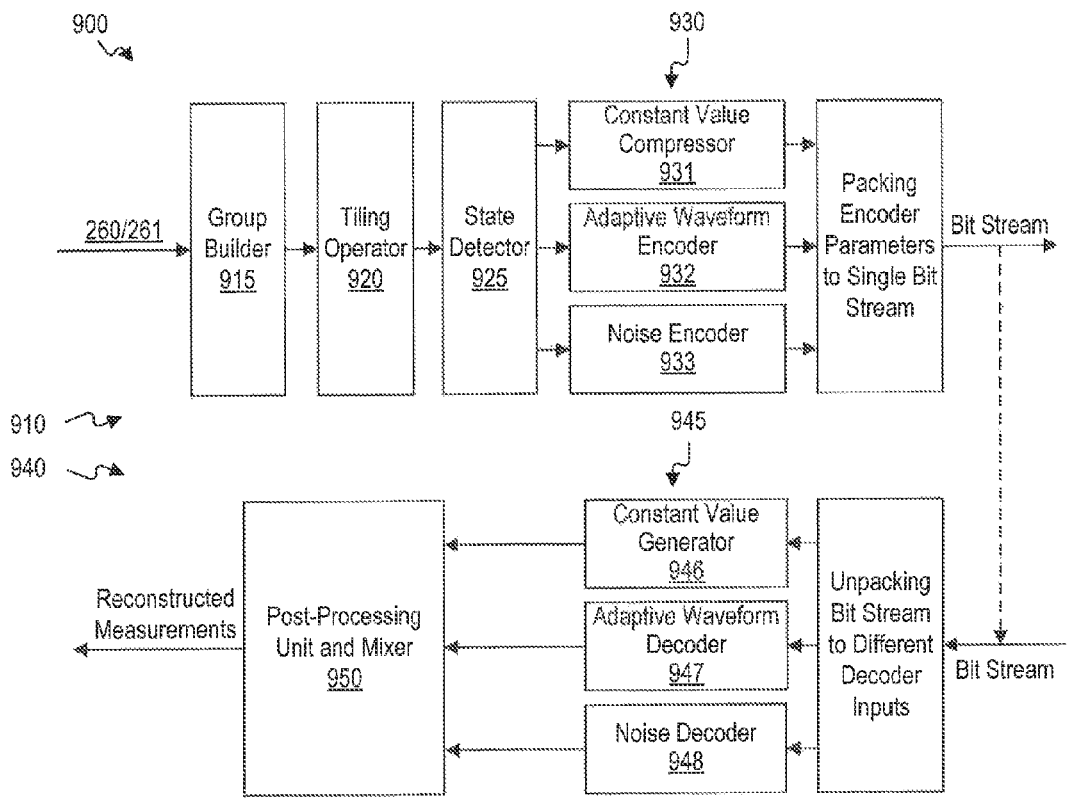
FIG. 9B illustrates a block diagram of an exemplary multi-state, low-delay, low-compression, lossless compressor.

For data structure information and PCM-encoded measurement data 260, in addition or as an alternative to the above-disclosed methods of compression, e.g., as described above with respect to PCM compression encoder 215A and other compression encoder 215C, a multistate lossless compression algorithm may be utilized. FIG. 9A illustrates a state machine of an exemplary multistate lossless compression including one of five possible states that PCM-encoded measurement data 260 and/or data structure information (i.e., other data 262) is in: constant level, slow-varying, periodical, transition, and random noise. FIG. 9B illustrates a block diagram of an exemplary multi-state, low-delay, low-complexity lossless compressor 900, including multi-state encoder 910 and multi-state decoder 940. Multi-state encoder 910 may be part of remote unit 110 and multi-state decoder 940 may be part of local unit 105. Multi-state encoder 910 may include a group builder 915, a tiling operator 920, a state detector 925, and various compression encoders 930 (e.g., constant value compressor 931, adaptive waveform encoder 932, and noise encoder 933). PCM-encoded measurements and/or data structure information may be input into group builder 915 to be grouped into similar measurements. Tiling operator 920 may divide each group into non-overlapping time segments, and state detector 925 may determine the state of each of the segments. According to the determined state, the segment may be compression encoded by one of encoders 930 before being packed into a bit-stream that may be transmitted to local unit 105 after shuffling, encryption, and packetization (see FIG. 2).

FIG. 9B also illustrates a block diagram of an exemplary multi-state decoder 940, which may reconstruct the data encoded by multi-state encoder 910 after it is received by local unit 105 and after it is depacketized, decrypted, and deshuffled (see FIG. 2). Multi-state decoder 940 may reconstruct the data by performing the reverse of the steps performed by multi-state encoder 910. Using various compression decoders 945 (e.g., constant value generator 946, adaptive waveform decoder 947, and noise decoder 948) and a post-processing unit and mixer 950. Additional details of multi-state low-delay, low-complexity lossless compressor 900 are described with respect to FIGS. 10-17.

Figure 10:
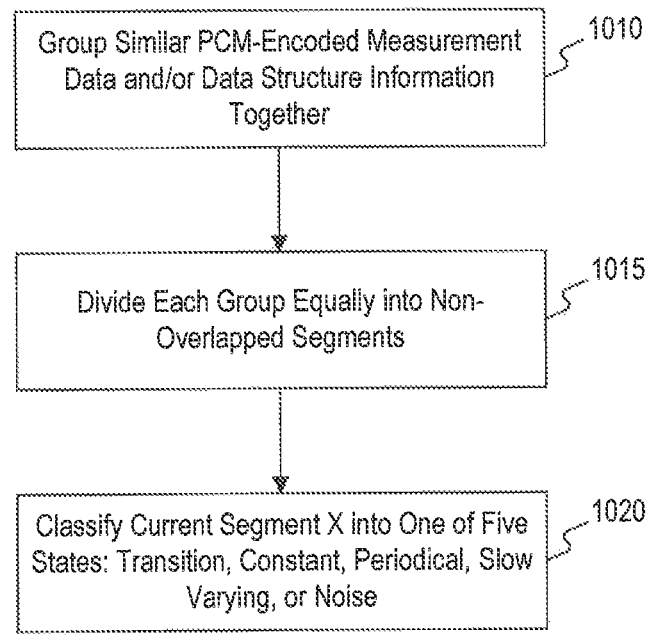
FIG. 10 illustrates a flowchart for an exemplary method of multi-state lossless compression.

FIG. 10 illustrates a flowchart for an exemplary method of multi-state lossless compression as performed by remote unit 110, or more specifically multi-state encoder 910, for example. At Step 1010, multi-state encoder 910 (more specifically, group builder 915) may group similar PCM-encoded measurement data 260 together and/or data structure information 262. Although all of PCM-encoded measurement data 260 may be correlated to each other to different degrees, in an exemplary embodiment and for simplicity, PCM-encoded measurement data 260 may be divided into the following groups: VIBE, GPSR, R3, S1, GPS, IMU, and Analog. The grouping may be made according to the definition of the telemetry file or the hardware interface. VIBE may correspond to various vibrometer measurements, which most of the time are stable and vary periodically, although sometimes the measurements have sudden fluctuations for certain periods of time. The various vibrometer measurements may be highly correlated. GPSR may correspond to Javad GPS data that includes timing and global position data. R3 may correspond to roll-stabilized inertial measurement unit data for spinning vehicle applications. S1 may correspond to IMU data that measures and reports velocity, orientation, acceleration, and gravitational forces related to remote unit 110. GPS may correspond to Global Positioning System data that includes date, time, Cartesian position, Cartesian velocity, latitude, longitude, altitude, geodetic position.

At Step 1015, multi-state encoder 910 may divide each group equally into non-overlapped segments to minimize delay. The step of dividing each group of measurements into non-overlapping equal-length segments may be referred to as a tiling operation and may be performed by tiling operator 920. The size of the segments may be directly related to the level of acceptable delay and the data memory requirements. In an exemplary embodiment, multi-state encoder 910 may select a multiple of major frame duration as the sizes of the segments. Measurements of different groups may use different segment sizes. In another exemplary embodiment, multi-state encoder 910 may select a segment size that is the same as the transmission packet duration to ensure that the delay due to compression does not affect the transmission during real-time operation of telemetry system 100.

For each segment, multi-state encoder 910 may identify the state to which the segment belongs and apply different compression models according to the states. At Step 1020, multi-state encoder 910 may classify a current segment X into one of the following states: constant, periodical, slow-varying, transition (rapid jump or sudden change), or random noise, and then compress the segment accordingly. In an exemplary embodiment, the default classification may be the transition state until multi-state encoder 910 has identified segment X as satisfying the condition for a different classification.

Figure 11:
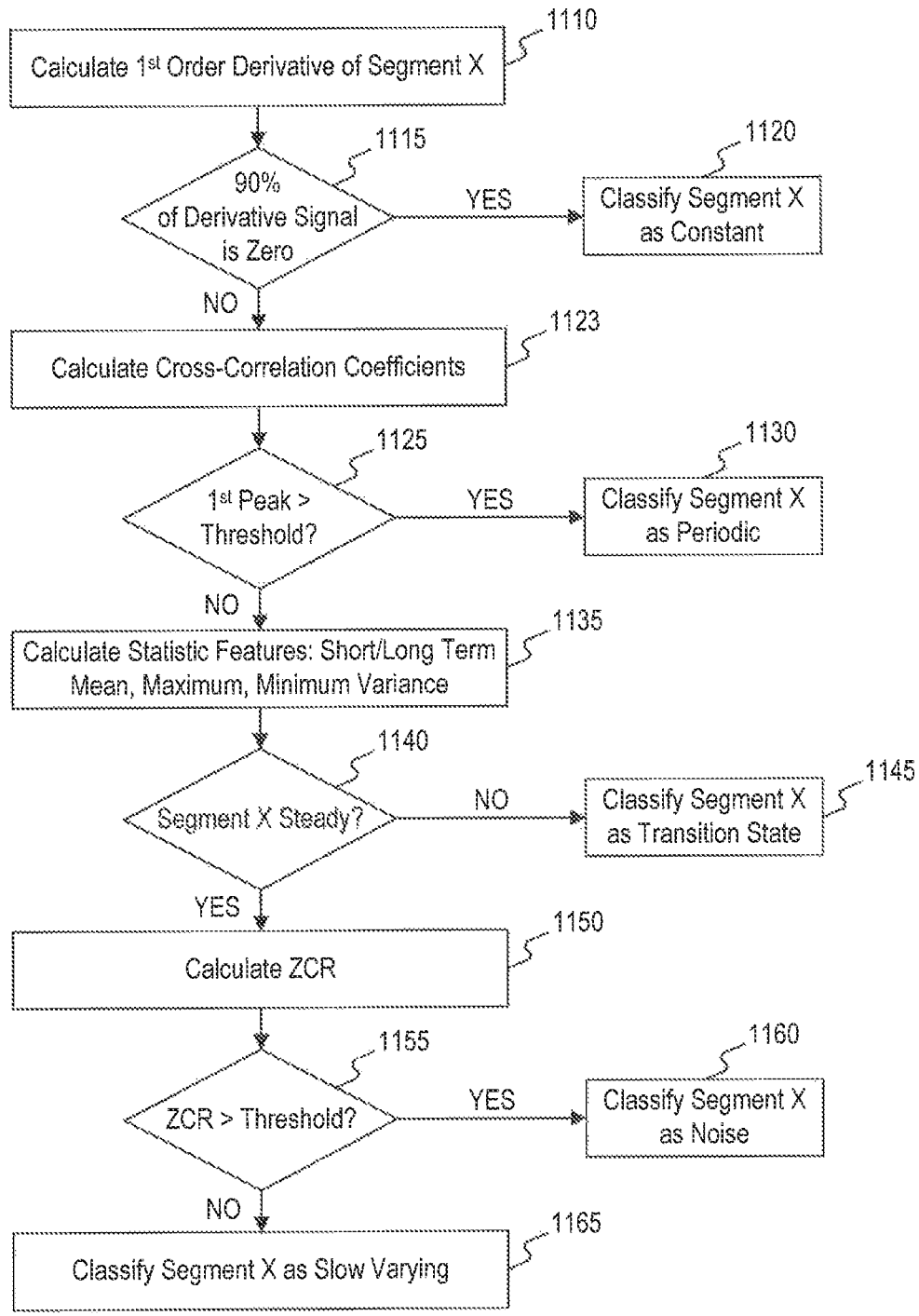
FIG. 11 illustrates a flowchart for an exemplary method of classification of a segment of telemetry data performed by the multi-state, low-delay, low-compression, lossless compressor of FIG. 9B.

FIG. 11 illustrates an exemplary method of classification of a current segment X in greater detail. At Step 1110, for a given segment X, multi-state encoder 910 may calculate the 1$^{st}$ order derivative of the signals of segment X to determine if segment X is constant. At Step 1115, multi-state encoder 910 may check if at least 90% of the first order derivatives have a value of zero. If at least 90% are zero (Step 1110: YES), multi-state encoder 910 may classify segment X as being in a constant state, and therefore segment X may be compressed by constant value compressor at Step 1120. Otherwise (Step 1110: NO), multi-state encoder 910 may determine if segment X exhibits periodicity by calculating cross-correlation coefficients for segment X according to Eq. 2, at Step 1123.

$$R(\tau) = \frac{E[(X_t - \mu)(X_{t+\tau} - \mu)]}{\sigma^2} \quad (2)$$

Equation 2 is more specifically an autocorrelation $R(\tau)$ of segment X as a function of time-shifts ($\tau$), i.e., a correlation of segment X with itself. If the $1^{st}$ peak of $R(\tau)$ (not at the origin) is greater than a threshold (Step 1125: YES), multi-state encoder 910 may classify that segment X as periodic, and segment X may be encoded and compressed by an adaptive waveform encoder, at Step 1130, for encoding as a periodic signal. Otherwise (Step 1125: NO), multi-state encoder 910 may determine, at Step 1135, various signal statistic features of segment X including, for example, short- and long-term means, minimum, maximum, and variance of amplitudes in segment X, and use the signal statistic features to determine whether segment X is steady. In an exemplary embodiment, multi-state encoder 910 may determine whether segment X is steady (at Step 1140) if segment X satisfies either of the following conditions, where Ds represents the derivative of the signal. Condition 1 is:

$$Ds_{max}/Ds_{min} < 4 \quad (3)$$

and $$Ds_{max}/D1 < 3 \quad (4)$$

where $Ds_{max} = \max\{D_S\}$, $D_{Smin} = \min\{Ds\}$, $Ds(i) = A_{Smax}(i) - A_{Smin}(i)$, and $D1 = A_{max} - A_{min}$, and where $A_{Smax}$ is the maximum amplitude of segment X, $A_{Smin}$ is the minimum amplitude of segment X, $A_{Smax}(i)$ is the maximum amplitude of the $i^{th}$ term period in segment X, and $A_{Smin}(i)$ is the minimum amplitude of the $i^{th}$ short term period in segment X. Condition 2 is:

$$(Std_{max} - Std_{min})/Std_{min} < 1 \quad (5)$$

where $Std_{max} = \max\{std(i)\}$, $Std_{min} = \min\{std(i)\}$, and $Std(i)$ is the standard deviation of the $i^{th}$ short term period.

If segment X satisfies at least one of the above conditions (1) or (2) (Step 1140: YES), multi-state encoder 910 may determine that segment X is in a steady state and proceed to Step 1150. If segment X satisfies neither of the above conditions (1) or (2) (Step 1140: NO), multi-state encoder 910 may classify segment X as in a transition state, and segment X may be compressed by a transition signal compressor at Step 1145. Otherwise, if multi-state encoder 910 determines that segment X is in a steady state, multi-state encoder 910 may further determine whether segment X is a slow-varying signal or a random noise segment by determining the zero-crossing rate (ZCR) of the signals in segment X, at Step 1150, and comparing whether the ZCR is greater than the predefined threshold, at Step 1155. The zero-crossing rate is the rate at which signals in segment X cross the zero-value from a positive value to a negative value and vice versa. If the ZCR is greater than the threshold (Step 1155: YES), multi-state encoder 910 may determine that segment X is a noise segment and segment X may be compressed by a random noise compressor at Step 1160. If the ZCR is lesser than the threshold (Step 1155: NO), multi-state encoder 910 may classify segment X as being in a slow-varying state and segment X may be compressed by a slow variation signal compressor at Step 1165.

A description of the various exemplary compressors for different states is given below. An exemplary embodiment of constant value compressor 931 may utilize run-length encoding because the majority of the data in segment X that is in the constant level state will be a single constant value. In another exemplary embodiment, constant value compressor 931 may be implemented using discontinuous transmission with extra redundancy for error correction. That is, some of the constant value signal may be represented by the absence of signal. In an exemplary embodiment, the non-constant values may be encoded as differential coding or linear prediction coding depending on their location and the pattern of occurrences. The complexity and memory requirement of the constant value compressor 931 may be very low, and the compressor may be able to reach a compression ratio on the order of hundreds to one without any information loss. The constant value compressor 931 may be used to compress, for example, the major frame counters (SYNC1, SYNC2), some segments of GPS data, and temperature monitoring data.

Figure 12:
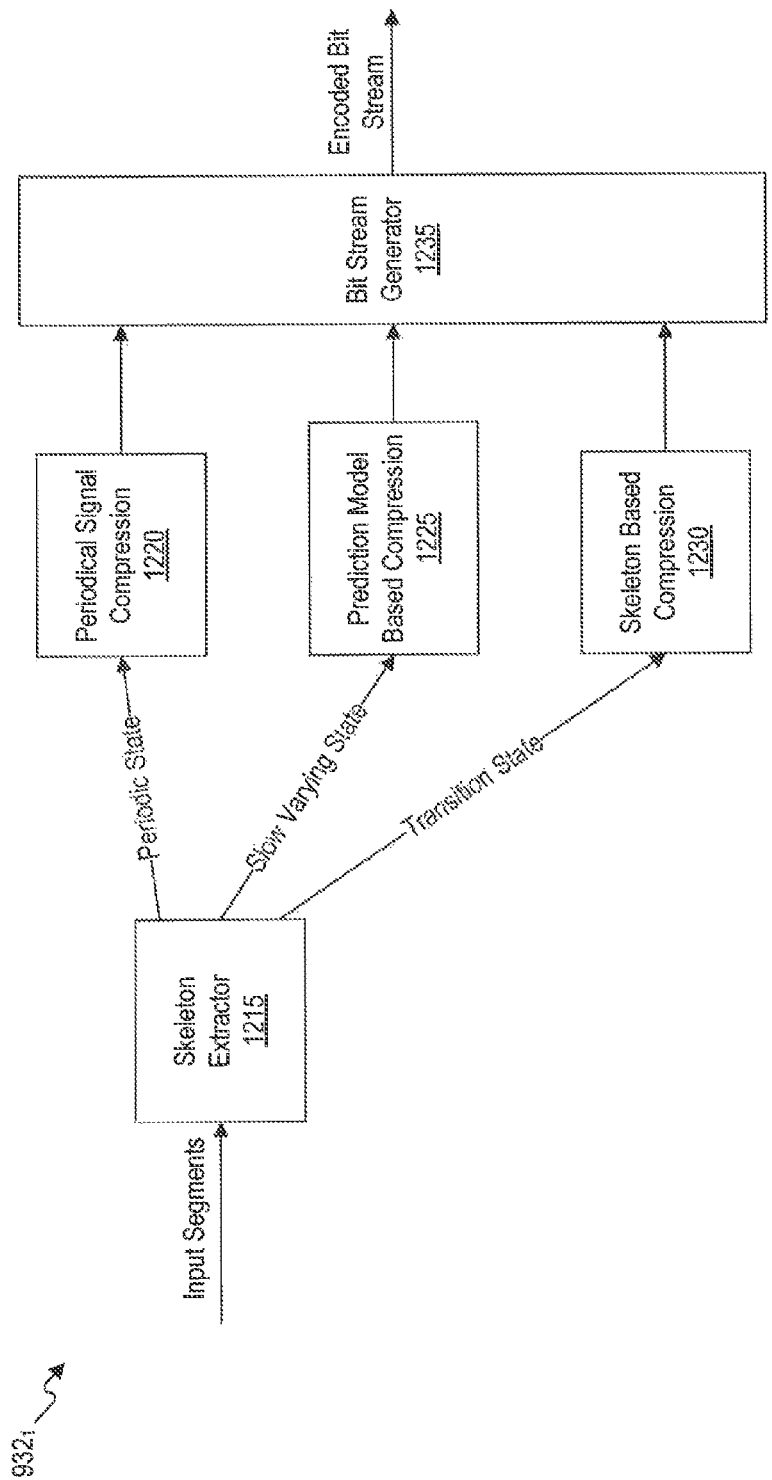
FIG. 12 illustrates a block diagram for an exemplary adaptive waveform encoder of FIG. 9B.

Adaptive waveform encoder 932 may be used to compress periodical, slow-varying, and transition state signals, i.e., adaptive waveform encoder 932 may be used as a periodic-waveform compressor used at Step 1130, a transition signal compressor used at Step 1145, and/or a slow variation signal compressor used at Step 1165. FIG. 12 illustrates an exemplary adaptive waveform encoder 932₁. Adaptive waveform encoder 932₁ may include a skeleton extractor 1215, a periodic-signal compression unit 1220, a prediction model-based compression unit 1225, a skeleton-based compression unit 1230, and a bit-stream generator 1235. In an exemplary embodiment, theme extractor 1215 may extract theme skeletons based on the state of segment X. If the segment is periodical, theme extractor 1215 may construct a skeleton based on the first period of segment X. Otherwise, theme extractor 1215 may divide segment X into sub-segments with equal length, and construct a skeleton based on the first sub-segment. A skeleton may be defined by a sequence of binary-coded values of amplitude and a corresponding sequence of amplitude-switching positions. Alternatively, a skeleton may be defined by a sequence of values, wherein each value is one of two possible values, and a corresponding sequence of amplitude-switching positions.

Figure 13:
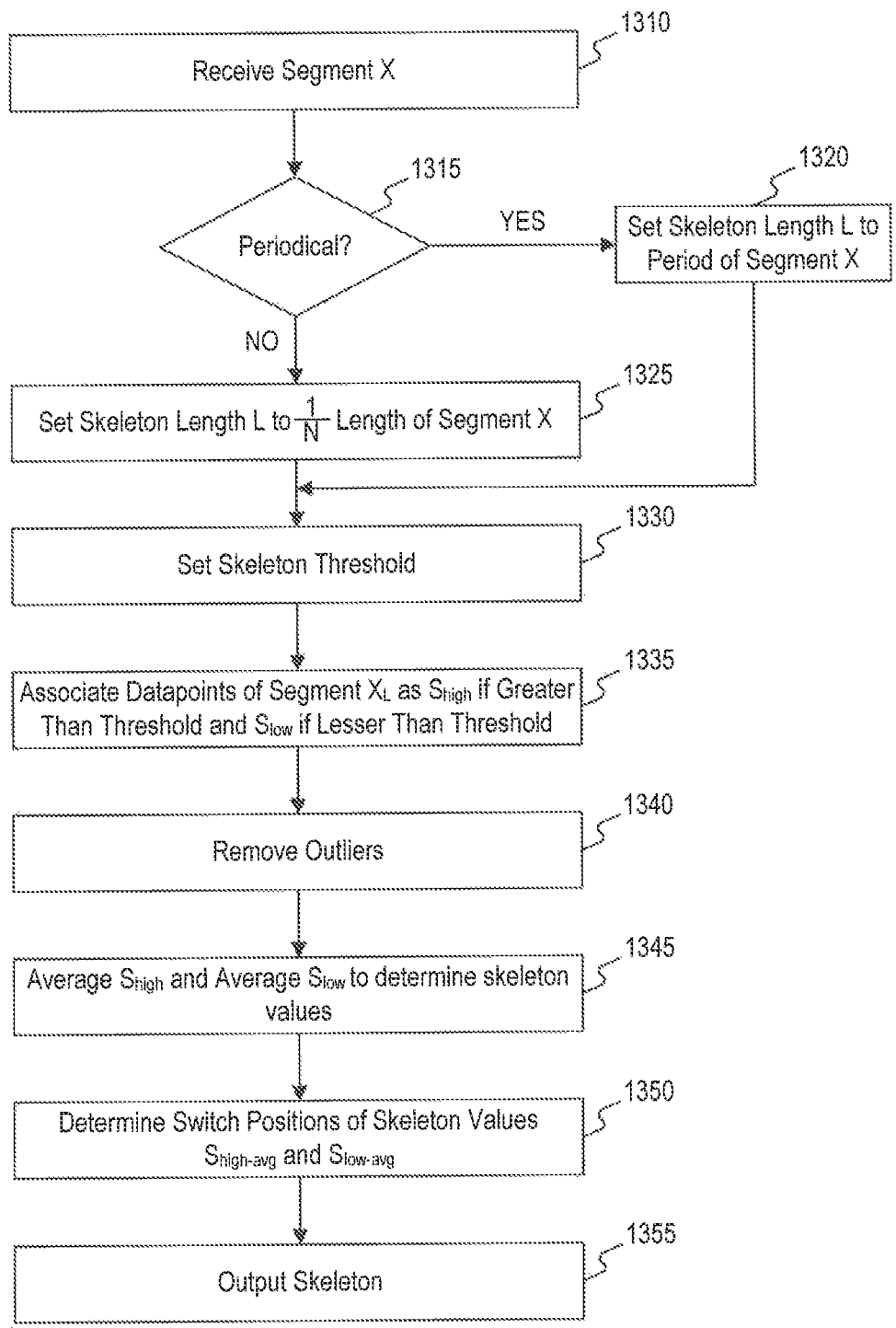
FIG. 13 illustrates a flowchart for an exemplary method of extracting a theme skeleton from a segment of telemetry data as performed by the adaptive waveform encoder of FIG. 12.

FIG. 13 illustrates a flowchart for an exemplary method of extracting a theme skeleton from segment X as performed by skeleton extractor 1215 of FIG. 12. At Step 1310, skeleton extractor 1215 may receive segment X, the determined state of segment X, and/or various extracted features of segment X. Skeleton extractor 1215 may check whether the state of segment X is periodical at Step 1315. If the state is periodical (Step 1315: YES), skeleton extractor 1215 may set a skeleton length L to be the period exhibited by segment X at Step 1320. If the state is not periodical (Step 1315: NO), skeleton extractor 1215 may set the skeleton length L to be 1/N of the length of segment X, where N is an integer, at Step 1325. For convenience, an L-length portion of segment X will be referred to as segment $X_L$, wherein $X_L$ may be a period-length portion of segment X for periodic states or a 1/N sub-segment of segment X for slowly-varying or transition states. At Step 1330, skeleton extractor 1215 may set a threshold to be equal to the middle value between the minimum value and the maximum value in segment $X_L$, specifically:

$$\text{Threshold} = X_{min} + (X_{max} - X_{min})/2 \quad (6)$$

At Step 1335, skeleton extractor 1215 may associate data points of segment $X_L$ as $S_{high}$ if the data point is greater than or equal to the threshold determined by Eq. 6, or associate a data point of segment S as $S_{low}$ if the data point is lesser than the threshold. As a result, a set of values may be associated with $S_{high}$ and another set of values may be associated with $S_{low}$. At Step 1340, skeleton extractor 1215 may remove outliers from $S_{high}$ and $S_{low}$. At Step 1345, skeleton extractor 1215 may average $S_{high}$ and average $S_{low}$ to determine skeleton values. For example, skeleton extractor 1215 may set the skeleton values to be either of these average values ($S_{high\_avg}$ and $S_{low\_avg}$). At Step 1350, skeleton extractor 1215 may determine switching positions for segment $X_L$. For example, skeleton extractor 1215 may determine the switching positions corresponding to the $S_{high\_avg}$ and $S_{low\_avg}$ skeleton values. Skeleton extractor 1215 may output the skeleton comprising the set skeleton values and the switching positions corresponding to these values, at Step 1355.

Figure 14:
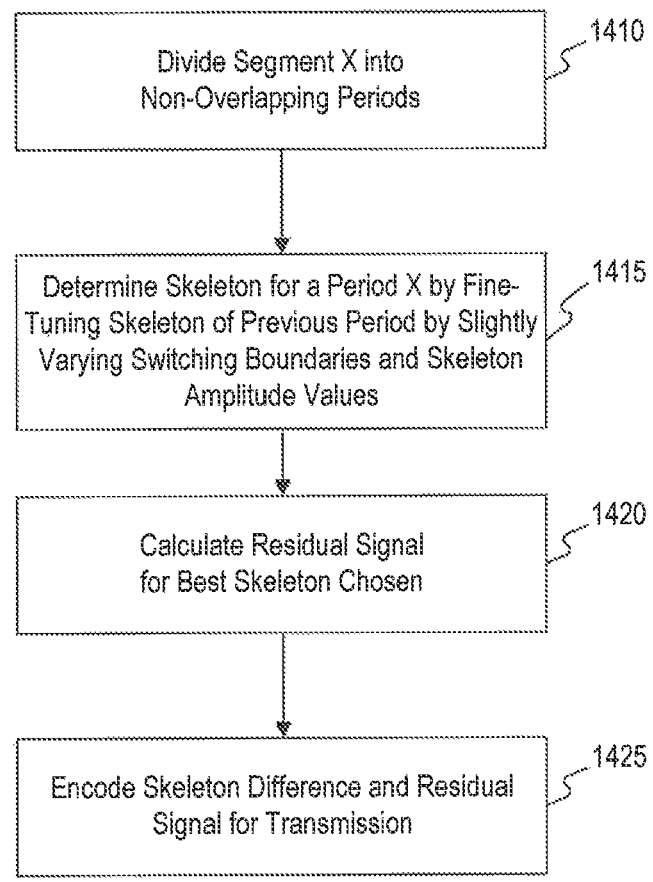
FIG. 14 illustrates a flowchart for an exemplary method of processing a data segment that is in a periodic state as performed by the adaptive waveform encoder of FIG. 12.

After extracting the skeleton from segment X, adaptive waveform encoder 932, may proceed with processing segment X based on whether segment X is in a periodic, slow-varying, or transition state. FIG. 14 illustrates a flowchart for an exemplary method of processing segment X in a periodic state. If segment X is periodic, periodic signal compression unit 1220 of FIG. 12 may process segment X by dividing segment X into non-overlapping periods, at Step 1410. At Step 1415, for each period, periodic signal compression unit 1220 may fine-tune the skeleton of the previous period by slightly varying switching boundaries and skeleton amplitude values to minimize mean square errors between the skeleton and the signal in the current period. At Step 1420, when the best skeleton is found and chosen, the residual signal may be calculated by subtracting the skeleton from the signal in the current period. At Step 1425, the skeleton differences and the residual signal may be encoded for transmission.

If segment X is slow-varying, prediction model-based compression unit 1225 may process segments $X_L$ using one of four prediction models: $2^{nd}$ order autoregressive (AR) prediction, $4^{th}$ order AR prediction, $6^{th}$ order AR prediction, and linear extrapolation prediction. Prediction model-based compression unit 1225 may calculate AR prediction coefficients by using a Levinson algorithm, and linear extrapolation prediction coefficients by using a Lagrange polynomial optimization process, and corresponding residuals. The best prediction model will provide the least number of bits requirement for representing the signal of segment $X_L$. Prediction model-based compression unit 1225 may compare the number of bits required with this best prediction model to the number of bits required by the skeleton and residual model, in which segment $X_L$ is represented by a skeleton model and a corresponding residual. Prediction model-based compression unit 1225 may then choose the best model between these two for segment $X_L$, and encode the corresponding parameters and residual data into a bit stream for transmission.

Figure 15:
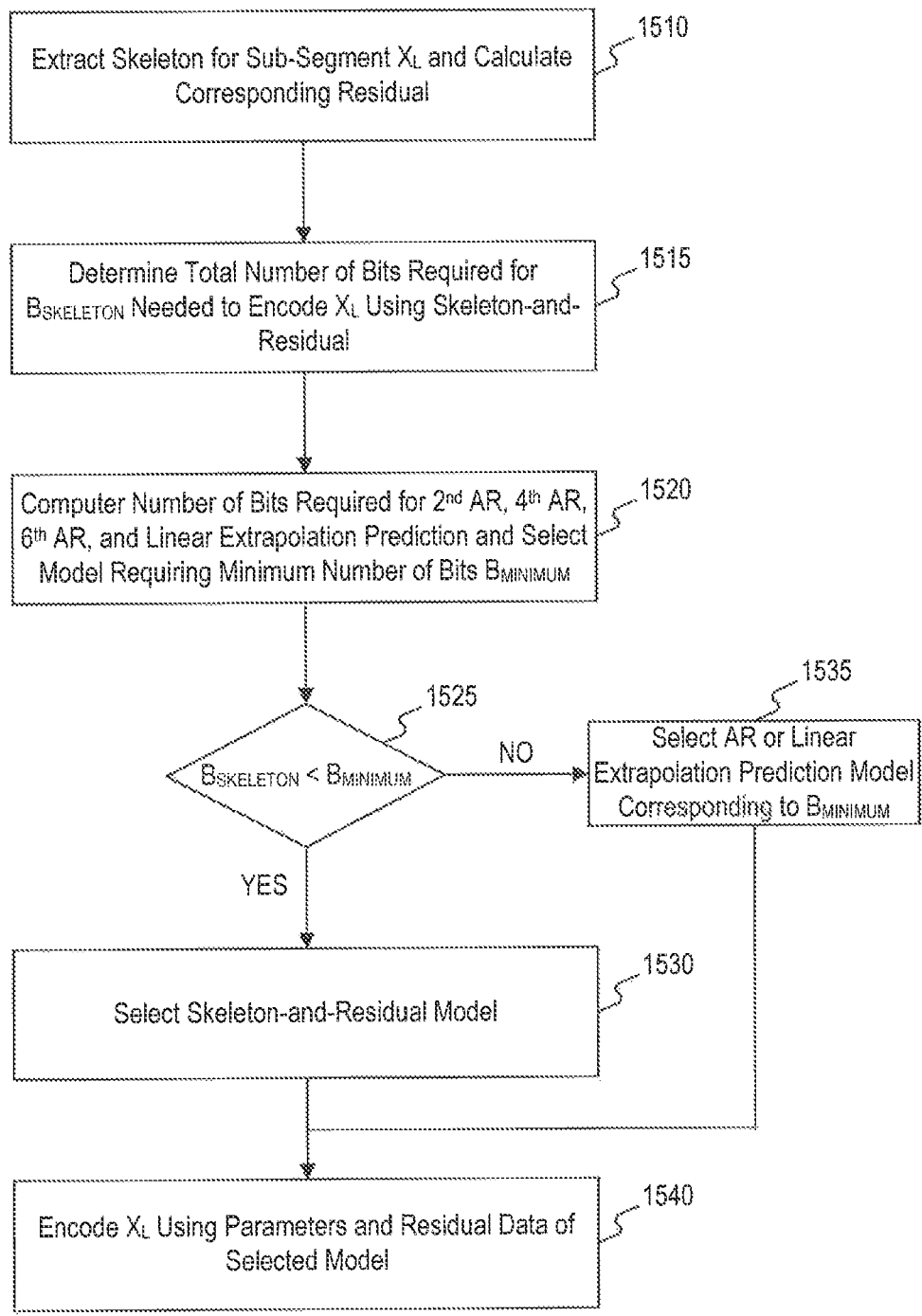
FIG. 15 illustrates a flowchart for an exemplary method of processing a data segment that is in a slow-varying state as performed by the adaptive waveform encoder of FIG. 12.

FIG. 15 illustrates a flowchart for an exemplary method of processing segment X in a slow-varying state. At Step 1510, skeleton extractor 1215 and/or prediction model-based compression unit 1225 may extract the skeleton of the first (1/N) sub-segment $X_L$ and calculate the corresponding residual. At Step 1515, prediction model-based compression unit 1225 may determine the total number of bits $B_{SKELTON}$ needed to encode first sub-segment $X_L$ using the skeleton-and-residual model. At Step 1520, prediction model-based compression unit 1225 may compute the required number of bits for $2^{nd}$ AR prediction, $4^{th}$ AR prediction, $6^{th}$ AR prediction, and linear extrapolation prediction, and find the prediction model requiring the minimum number of bits $B_{MINIMUM}$. At Step 1525, prediction model-based compression unit 1225 may determine whether $B_{SKELETON}$ is lesser than $B_{MINIMUM}$. If $B_{SKELETON}$ is lesser than $B_{MINIMUM}$ (Step 1525: YES), prediction model-based compression unit 1225 may select the skeleton-and-residual model at Step 1530. If $B_{SKELETON}$ is not lesser than $B_{MINIMUM}$ (Step 1525: NO), prediction model-based compression unit 1225 may select the AR or linear extrapolation prediction model corresponding to $B_{MINIMUM}$ at Step 1535. At Step 1540, prediction model-based compression unit 1225 may encode segment $X_L$ using the parameters and residual data of the model selected at Step 1525.

Figure 16:
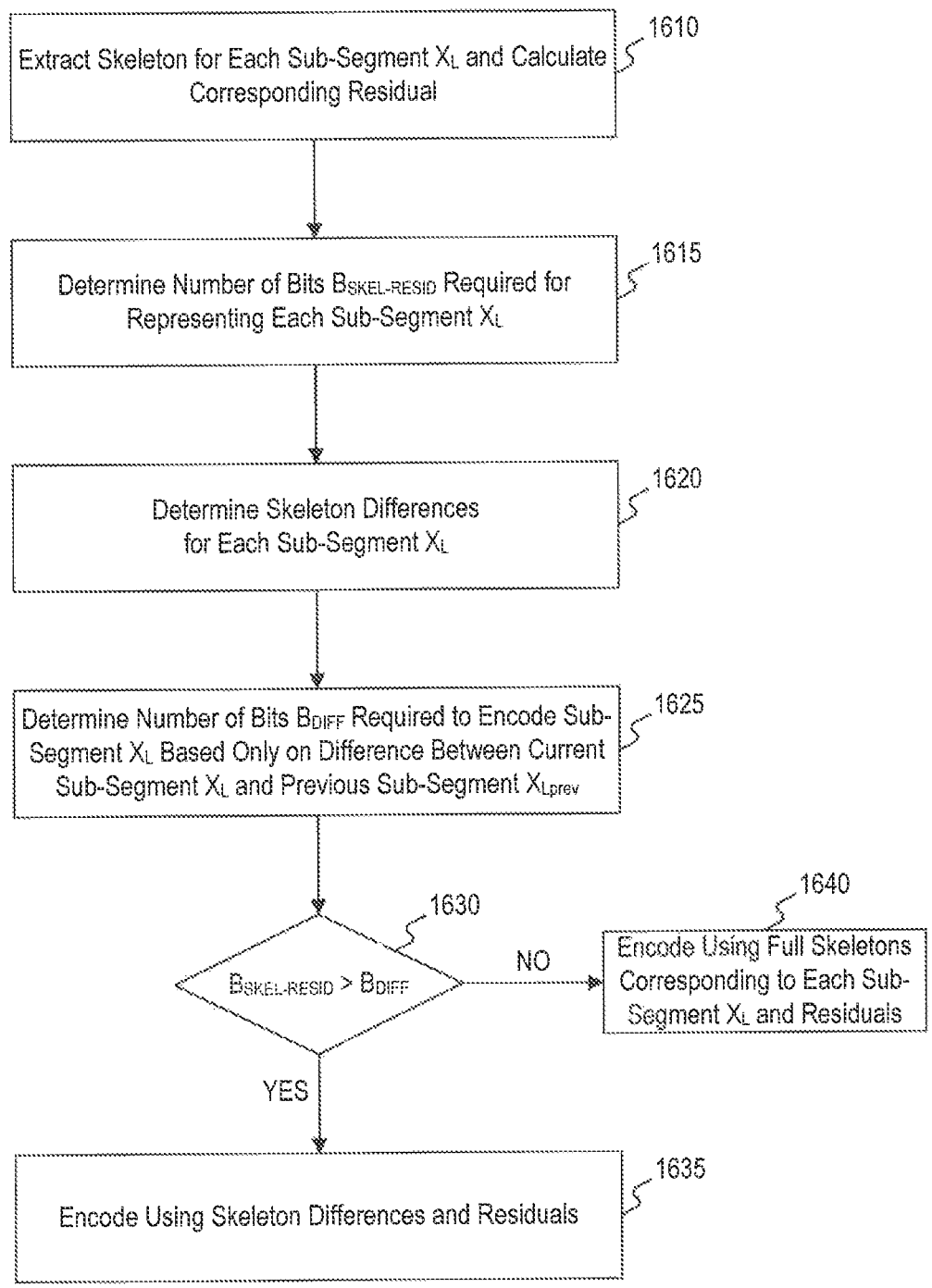
FIG. 16 illustrates a flowchart for an exemplary method of processing a data segment that is in a transition state as performed by the adaptive waveform encoder of FIG. 12.

If segment X is in a transition state, skeleton-based compression unit 1230 may process segment X according to, for example, the exemplary method illustrated in the flowchart of FIG. 16. At Step 1610, skeleton-based compression unit 1230 and/or skeleton extractor 1615 may extract the skeleton for each sub-segment $X_L$ and calculate the corresponding residual. At Step 1615, skeleton-based compression unit 1230 may then determine the number of bits $B_{SKEL-RESID}$ required for representing each sub-segment $X_L$ with the skeleton-and-residual model. At Step 1620, skeleton-based compression unit 1230 may determine skeleton differences for each sub-segment $X_L$ based on a previous sub-segment $X_L$. At Step 1625, skeleton-based compression unit 1230 may determine the number of bits $B_{DIFF}$ required to encode sub-segment $X_L$ based on only the difference between the current sub-segment $X_L$ and the previous sub-segment $X_{Lprev}$. At Step 1630, skeleton-based compression unit 1230 may determine whether $B_{SKEL-RESID}$ is greater than $B_{DIFF}$. If $B_{SKEL-RESID}$ is greater than $B_{DIFF}$ (Step 1630: YES), sub-segments $X_L$ may be encoded using skeleton differences and residuals at Step 1635. If $B_{SKEL-RESID}$ is lesser than $B_{DIFF}$ (Step 1630: NO), sub-segments $X_L$ may be encoded using full skeletons corresponding to each sub-segment $X_L$ and residuals at Step 1640.

Figure 17:
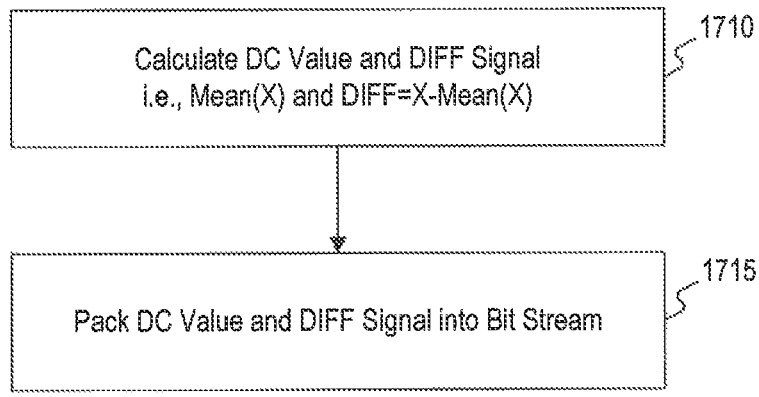
FIG. 17 illustrates a flowchart for an exemplary method of processing a data segment that is noise as performed by noise encoder of FIG. 9B.

For constant, periodic, slow-varying, and transition states, various compression methods as described above may result in desirable compression ratios for segment X data signals. A small percentage of the telemetry data, however, may show no or extremely low correlation in certain segments, and their waveform may look like random noise. Theoretically, such data may not be able to be compressed without information loss. There may be almost no compression for noise data, i.e. the compression ratio is about 1:1. FIG. 17 shows an exemplary compression encoding method for noise data. At Step 1710, a noise encoder may calculate the DC value of segment X, i.e., the mean value of X, and a difference signal DIFF=X−mean(x). At Step 1715, the noise encoder may pack the DC value and the DIFF signal into a bit-stream for transmission.

It is contemplated that a compression encoding may be specially designed for the compression of VIBE data. As all components of VIBE data may be highly correlated, it may be more efficient to compress them jointly. Based on the statistics of VIBE data, a compression algorithm may categorize VIBE samples into 3 states: slow-varying, rapid-changing, and slow-varying with impulse. The algorithm may include a stable stage over a long-term period, which may be a minimum period of 50 frames and a maximum of 400 frames. Cross-correlation may be used to detect the period, and then a prediction model may be used based on the detected period. In an exemplary embodiment, the compression algorithm may involve automatic switches between states of slow variation and sudden fluctuation.

With reference back to FIG. 2, after data 126 has been compressed and encoded according to the characteristics of the data, bit-stream shuffler 220 may receive the compression-encoded data as a bit stream and proceed to shuffle the bit stream so as to remove possibly predictable patterns added by the compression encodings. The potentially predictable patterns in compressed data are present when both the encoder and decoder share commonly defined bit allocations. Since any parameters in the compressed domain are represented by a group of continuous bits, the intrinsic connection among the parameters will appear as repeatable patterns in compressed bit streams when observed over a long enough period. To break the repeatable patterns, bit-stream shuffler 220 may be used to introduce multiple levels of randomness to produce random bit allocation in the final bit-stream.

Figure 18:
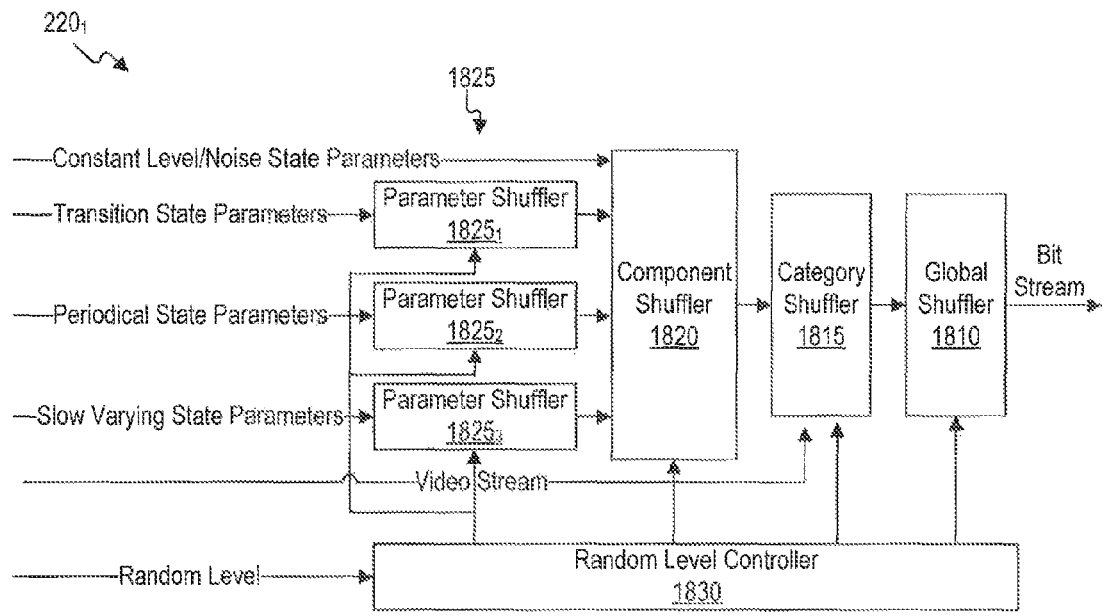
FIG. 18 shows a block diagram of an exemplary bit-stream shuffler of FIG. 2.

FIG. 18 shows details of a bit-stream shuffler 220, as an exemplary embodiment of bit-stream shuffler 220 of FIG. 2. There may be four levels of randomness generated by bit-stream shuffler $220_1$. The first level of randomness may be generated by a global shuffler 1810, which alternates big-endian and little-endian presentation every n bytes in the bit stream. The second level of randomness may be generated by the category shuffler 1815, which randomly alternates category numbers (e.g., 1, 2, or 3) with predefined probabilities so that category types are randomly located in the bit streams. The third level of randomness may be generated and introduced by a component shuffler 1820. In a manner similar to the category shuffler 1815, the component shuffler 1820 may randomly allocate the order of data sources, so that correlation among different data sources will not generate a repeated pattern in the bit streams. The fourth level of randomness may be introduced by a parameter shuffler 1825 such as parameter shufflers $1825_1$, $1825_2$, and/or $1825_3$, which may randomly assign bit allocation in individual encoding processes, based on segment states. For example, parameter shuffler $1825_1$ may randomly assign bit allocation in the encoding process of segments in the transition state, parameter shuffler $1825_2$ may do the same for segments in the periodical state, and parameter shuffler $1825_3$ may do the same for segments in the slow-varying state. Depending on the encryption algorithm, the shuffler may be configured to use different level shufflers. Different level shufflers may be enabled or disabled independently by random level controller 1830 to provide multiple combinations of randomness to remove potential threads for different security and complexity requirements. The common random level and random number generators may be shared between the encoder in remote unit 110 and the decoder in local unit 105. The various shufflers 1810, 1815, 1820, and 1825 do not affect compression ratios. In local unit 105, bit-stream deshuffler 245 may include specific deshuffler components that correspond to the various shufflers 1810, 1815, 1820, and/or 1825. These deshufflers should use the same seeds as their corresponding shufflers for the random generators that generate the randomness applied by the bit-stream shuffler 220, and decoded by bit-stream deshuffler 245, so that bit-stream deshuffler 245 may automatically reorder the encoded bit-streams to their original forms for decoding.

Figure 19:
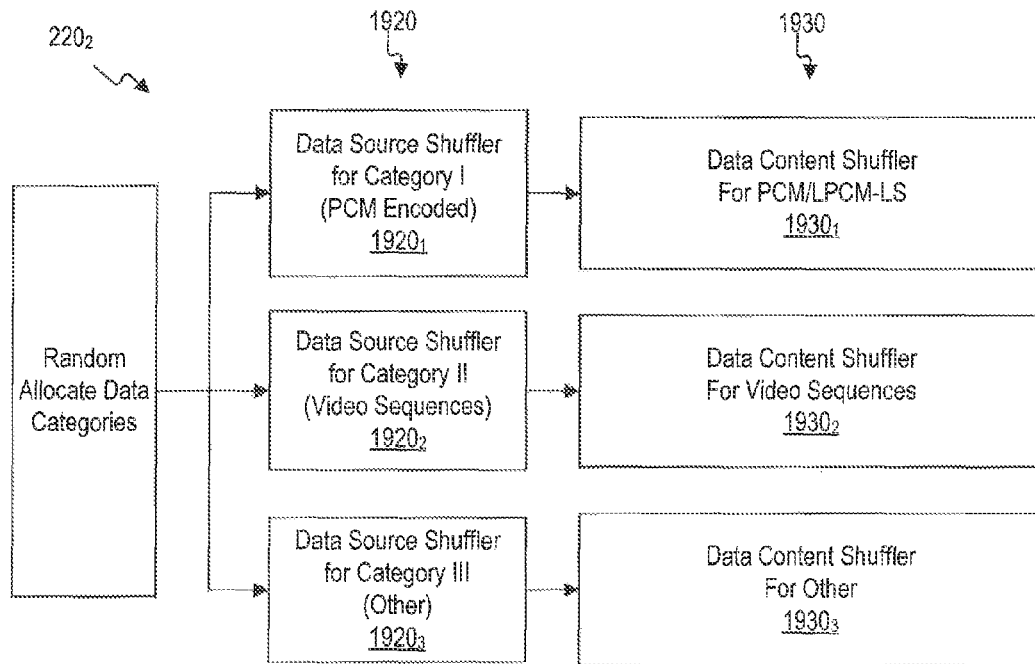
FIG. 19 shows a block diagram of another exemplary bit-stream shuffler of FIG. 2.

FIG. 19 illustrates bit-stream shuffler $220_2$ as another exemplary embodiment of bit-stream shuffler 220 of FIG. 2. A first level of randomness may be created based on data types, and more specifically based on the number of data sources of each category. Date type shuffler 1910 may randomly generate category numbers (e.g., 1, 2, and 3) with predefined probabilities, so that the category types (e.g., PCM-encoded, image, and other) are randomly located in bit-streams. A second level of randomness may be introduced at the bit location of data sources. Data source shufflers 1920 (including, e.g., $1920_1$, $1920_2$, and/or $1920_3$) may randomly allocate the order of its data sources, so that the correlation among different data sources will not generate repeatable patterns in the bit streams. For example, data source shuffler $1920_1$ may shuffle the order of different sources of PCM-encoded data, $1920_2$ may shuffle the order of different sources of video sequences data, and $1920_3$ may shuffle the order of other types of data. A third level of randomness may be introduced by data content shufflers 1930 (including, e.g., $1930_1$, $1930_2$, and/or $1930_3$) as bit allocation within data from an individual data source, and may vary with compression methods. Depending on the subsequent encryption algorithm, shuffling at this level may have different granularities from randomly allocating bit streams according to objects or groups or further down to the byte level. For example, data content shuffler $1930_1$ may, for low-delay, low-complexity lossless encoded LPCM or logarithmic PCM data, randomly locate the order of quantization segments and quantization indexes in bit stream, and/or may switch big-endian and little-endian representation for every n bytes in the bit stream. As another example, data content shuffler $1930_2$ may, for video sequence data, randomly locate the order of object contents and encoded residuals, and/or may switch big-endian and little-endian representation for every n bytes in the bit stream. Data content shuffler $1930_3$ may, for other data, randomly locate the order of groups of data, and/or may switch big-endian and little-endian representation for every n bytes in the bit stream.

As adding randomness in deep levels of bit streams may increase the computation complexity, and depending on the encryption method that follows, adding three or four levels of randomness may not be necessary. It is contemplated that bit-stream shuffler 220 may be configured to adjust a desired randomness level.

With reference back to FIG. 2, after bit stream shuffler 220 has shuffled the bit stream, encrypter 225 may encrypt the bit stream. In an exemplary embodiment, the shuffling process may be tuned to correspond with a particular encryption algorithm that is being used to minimize the randomness level and computation complexity above a certain amount. After encryption, packetizer 230 may group the encrypted and encoded bit stream into packets for transmission to local unit 105 using specific transmission protocols. Protocol packetization may be important for efficiency of bandwidth use, and therefore careful selection of protocol, packet size, network jitter buffer sitting, etc., may be important. It is contemplated that any encryption method and/or any packetization method or protocol may be implemented. It is also contemplated that encypter 225 and decrypter 240 may be omitted. In local unit 105, depacketizer 235 may reconstruct the encrypted, encoded bit-stream from the transmitted packets, decrypter 240 may decrypt the bit-stream, and bit-stream deshuffler may deshuffle the bit-stream. Decoders 250 may decode the compression encoding of various types of data 126, which then may be mixed back together by data mixer 255.

The disclosed real-time, low-delay, low-complexity lossless compression method may be specifically used with target vehicle telemetry, but is not necessarily limited to such applications. General lossless compression algorithms often reach less than 3:1 compression ratio on average. It is contemplated that the disclosed systems and methods may be able to achieve compression ratios of 5:1 or greater by utilizing the characteristics of data sources and correlations among different data sources, in order to remove higher order redundancy. Each compression algorithm of various types may be used independently or in various combinations. Multilevel randomness that is introduced into encoded bit-streams maintains a level of security by removing patterns that result from the compression algorithms.

It will be apparent to those skilled in the art that various modifications and variations can be made to the disclosed telemetry system. Other embodiments will be apparent to those skilled in the art from consideration of the specification and practice of the disclosed telemetry system. It is intended that the specification and examples be considered as exemplary only, with a true scope being indicated by the following claims and their equivalents.

What is claimed is:

1. A method for transmitting data, comprising:
    receiving data from two or more data sources;
    selectively classifying the data into at least two input data streams, the at least two data streams including a one dimensional data stream, called an encoded data stream, and an imagery data stream, which can include still images or video or both; and
    separately compressing the one dimensional data stream into a first compressed bit-stream and the imagery data stream into a second compressed bit-stream;
    combining the first compressed bit-stream and the second compressed bit-stream into a packetized bit-stream;
    encrypting the packetized bit-stream to generate encrypted data packets prepared for transmission,
    wherein the one dimensional data stream is tiled into non-overlap segments using a state detection algorithm that categorizes the non-overlap segments into different states, wherein the different states include a constant level state, a periodical change state, a slow variation state, a random noise state, and a transition state, and
    wherein corresponding encoders are used to compress each of the categorized segments.

2. The method of claim 1, wherein compressing the one-dimensional data stream comprises:
    using a prediction model to generate predicted one-dimensional data;
    determining a difference between the predicted one-dimensional data and the one-dimensional data; and
    encoding the difference with a compression encoder.

3. The method of claim 2, wherein:
    the one-dimensional data stream comprises logarithmic one-dimensional data, and
    data corresponding to quantization segments of the one-dimensional data stream is encoded separate from data corresponding to quantization indexes of the logarithmic one-dimensional data.

4. The method of claim 3, wherein:
    the data corresponding to quantization segments is encoded by using run-length coding;
    the data corresponding to quantization indexes is encoded by generating predicted data corresponding to quantization indexes and encoding the difference between the predicted data and the data corresponding to the quantization indexes using a compression encoder.

5. The method of claim 1, wherein the imagery data stream comprises video and compressing the imagery data stream comprises:
    extracting offset information from the video;
    compressing the video based on data within one frame of the video using an intra-frame prediction method; and
    compressing the video based on data of several frames of the video using an inter-frame prediction method.

6. The method of claim 1, wherein the combining the first compressed bit-stream and the second compressed bit-stream comprises shuffling the first and second compressed bit-streams into a shuffled bit-stream,
    wherein shuffling the first compressed bit-stream and the second compressed bit-stream comprises at least one of: randomly allocating data of different classifications in the shuffled bit-stream; randomly allocating an order of data from different data sources in the shuffled bit-stream; or randomly allocating bit allocation within data from each specific data source in the shuffled bit-stream.

7. A data transmission system, comprising:
    a local unit comprising a receiver; and
    a remote unit, the remote unit comprising transducers, a processor, and a transmitter;
        the transducers are configured to generate at least two data streams;
        the processor is configured to compress the data by:
            selectively classifying the data streams from the transducers into classifications including at least a one-dimensional data stream and an imagery data stream, and
            separately compressing the one dimensional data stream into a first compressed bit-stream and the imagery data stream into a second compressed bit-stream; and
        the transmitter is configured to transmit the first compressed bit-stream and the second compressed bit-stream to the local unit,
    wherein the processor is further configured to:
    tile the one dimensional data stream into non-overlap segments using a state detection algorithm that categorizes the non-overlap segments into different states,
    wherein the different states include a constant level state, a periodical change state, a slow variation state, a random noise state, and a transition state, and
    compress each of the categorized segments using corresponding encoders.

8. The system of claim 7, wherein compressing the one-dimensional data stream comprises:
    using a prediction model to generate predicted one-dimensional data;
    determining a difference between the predicted one-dimensional data and the one-dimensional data; and
    encoding the difference with a compression encoder.

9. The system of claim 8, wherein:
    the encoded data stream comprises logarithmic one-dimensional data, and
    data corresponding to quantization segments of the one-dimensional data is encoded separate from data corresponding to quantization indexes of the logarithmic one-dimensional data.

10. The system of claim 9, wherein:
    the data corresponding to quantization segments is encoded by using run-length coding;
    the data corresponding to quantization indexes is encoded by generating predicted data corresponding to quantization indexes and encoding the difference between the predicted data and the data corresponding to the quantization indexes using a compression encoder.

11. The method of claim 1, wherein separately compressing the one-dimensional data stream and the imagery data stream comprises compressing the one-dimensional data stream using a frame based waveform compression method.

12. The system of claim 7, wherein separately compressing the one-dimensional data stream and the imagery data stream comprises compressing the one-dimensional data stream using a frame based waveform compression method.

13. The method of claim 1, wherein:
the corresponding encoders use one or more of the following different compression methods for the different states: a constant compressor for constant states, a noise encoder for random noise states, and an adaptive waveform encoder for rest types of states.

14. The system of claim 7, wherein the processor is further configured to:
compute first order derivatives of each of the non-overlap segments of the at least two data streams using the state detection algorithm,
wherein the constant level state is determined when a majority of the first order derivatives of each of the non-overlap segments are zeros, and
calculate cross-correlation coefficients and define the periodical change state when a first peak is above a threshold.

15. The system of claim 13, wherein:
the adaptive waveform encoder creates prediction samples using corresponding prediction models based on the different states, computes prediction residuals, and encodes the prediction residuals using entropy coding methods.

16. The system of claim 7, further comprising:
a random noise encoder, implemented by the processor, that first calculates the mean of first order derivatives, calculates the dynamic range with the mean removal, and encodes the mean and corresponding zero mean first order derivatives using minimum number of bit requirement.

17. The system of claim 7, further comprising:
a constant value compressor, implemented by the processor, that encodes the constant value if all the samples of first order derivatives are zeros and encodes the constant values, the number of non-zeros, the pairs of position, and values of the non-zeros.

18. The system of claim 15, wherein:
the adaptive waveform encoder computes a total number of bits required for a skeleton and residual representation, $2^{nd}$, $4^{th}$ and $6^{th}$ order auto regression prediction models with corresponding residual representation, and chooses the representation with a minimum number of bits requirement.

* * * * *

UNITED STATES PATENT AND TRADEMARK OFFICE
CERTIFICATE OF CORRECTION

PATENT NO. : 9,953,436 B2
APPLICATION NO. : 13/927028
DATED : April 24, 2018
INVENTOR(S) : Dunling Li Page 1 of 1

It is certified that error appears in the above-identified patent and that said Letters Patent is hereby corrected as shown below:

In the Specification

Column 1, Line 14, to Column 1, Line 18, after the "GOVERNMENT RIGHTS" heading, should read:
This invention was made with government support under the terms of Contract No. HQ0147-13-C-7308 and Contract No. HQ0147-14-C-7024 awarded by the Missile Defense Agency (MDA). The government may have certain rights to this invention.

Signed and Sealed this
Twenty-third Day of June, 2020

Andrei Iancu
*Director of the United States Patent and Trademark Office*